(12) United States Patent
Yeo et al.

(10) Patent No.: US 11,290,204 B2
(45) Date of Patent: Mar. 29, 2022

(54) METHOD AND APPARATUS FOR DETERMINING TRANSPORT BLOCK SIZE IN COMMUNICATION OR BROADCASTING SYSTEM

(71) Applicant: Samsung Electronics Co., Ltd., Gyeonggi-do (KR)

(72) Inventors: Jeongho Yeo, Gyeonggi-do (KR); Hyojin Lee, Seoul (KR); Sungjin Park, Incheon (KR); Jinyoung Oh, Seoul (KR)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 16/644,324

(22) PCT Filed: Sep. 6, 2018

(86) PCT No.: PCT/KR2018/010442
§ 371 (c)(1),
(2) Date: Mar. 4, 2020

(87) PCT Pub. No.: WO2019/050304
PCT Pub. Date: Mar. 14, 2019

(65) Prior Publication Data
US 2020/0213032 A1     Jul. 2, 2020

(30) Foreign Application Priority Data

Sep. 8, 2017  (KR) .................. 10-2017-0115469
Sep. 28, 2017  (KR) .................. 10-2017-0126327

(51) Int. Cl.
*H04L 1/00*          (2006.01)
*H04L 27/26*         (2006.01)
(Continued)

(52) U.S. Cl.
CPC .......... *H04L 1/0006* (2013.01); *H04L 1/0009* (2013.01); *H04L 1/0033* (2013.01);
(Continued)

(58) Field of Classification Search
CPC ... H04L 1/0005; H04L 1/0009; H04L 1/0033; H04L 1/0057; H04L 27/2602; H04W 28/06; H04W 72/1205; H04W 72/1278
(Continued)

(56) References Cited

U.S. PATENT DOCUMENTS

2016/0081063 A1    3/2016  Chen et al.
2017/0156131 A1    6/2017  Kimura et al.
(Continued)

FOREIGN PATENT DOCUMENTS

| EP | 3 471 304 | 4/2019 |
|----|-----------|--------|
| KR | 1020190010375 | 1/2019 |
| WO | WO 2019/030734 | 2/2019 |

OTHER PUBLICATIONS

European Search Report dated Jul. 28, 2020 issued in counterpart application No. 18853834.2-1220, 7 pages.
(Continued)

*Primary Examiner* — Loi H Tran
(74) *Attorney, Agent, or Firm* — The Farrell Law Firm, P.C.

(57) ABSTRACT

The present disclosure relates to a communication technique that combines, with IoT technology, 5G communication system for supporting a higher data transfer rate than a 4G system, and a system therefor. The present disclosure can be applied to intelligent services, such as smart homes, smart buildings, smart cities, smart cars or connected cars, health care, digital education, retail businesses, security and safety related services, etc. on the basis of 5G communication technologies and IoT related technologies. Disclosed, in the
(Continued)

present invention, are a method and an apparatus for determining the size of a transport block in a communication or broadcasting system.

16 Claims, 8 Drawing Sheets

(51) Int. Cl.
*H04W 28/06* (2009.01)
*H04W 72/12* (2009.01)

(52) U.S. Cl.
CPC ........ *H04L 1/0057* (2013.01); *H04L 27/2602* (2013.01); *H04W 28/06* (2013.01); *H04W 72/1205* (2013.01); *H04W 72/1278* (2013.01)

(58) Field of Classification Search
USPC .................................................... 375/240.24
See application file for complete search history.

(56) References Cited

U.S. PATENT DOCUMENTS

| | | |
|---|---|---|
| 2019/0028229 A1 | 1/2019 | Yeo et al. |
| 2019/0173615 A1 | 6/2019 | Andersson et al. |
| 2020/0177303 A1* | 6/2020 | Ma ...................... H03M 13/116 |
| 2020/0235759 A1* | 7/2020 | Ye ...................... H03M 13/116 |

OTHER PUBLICATIONS

PCT/ISA/210 Search Report issued on PCT/KR2018/010442, pp. 5.
PCT/ISA/237 Written Opinion issued on PCT/KR2018/010442, pp. 6.
Ericsson, "Code Block Segmentation for LDPC Codes", 3GPP TSG RAN WG1 Meeting #90, R1-1714547, Prague, P.R. Czechia, Aug. 12, 2017, pp. 5.
ZTE, "Consideration on coding chain for eMBB data channel", 3GPP TSG RAN WG1 Meeting #89, R1-1707177, Hangzhou, China, May 7, 2017, pp. 9.
Nokia, Alacatel-Lucent Shanghai Bell, "Code block segmentation of eMBB", 3GPP TSG RAN WG1 NR Ad-Hoc#2, R1-1711534, Qingdao, P.R. China, Jun. 19, 2017, pp. 8.

* cited by examiner

METHOD AND APPARATUS FOR DETERMINING TRANSPORT BLOCK SIZE IN COMMUNICATION OR BROADCASTING SYSTEM

PRIORITY

This application is a National Phase Entry of PCT International Application No. PCT/KR2018/010442 which was filed on Sep. 6, 2018, and claims priority to Korean Patent Application Nos. 10-2017-0115469 and 10-2017-0126327, which were filed on Sep. 8, 2017 and Sep. 28, 2017, respectively, the content of each of which is incorporated herein by reference.

TECHNICAL FIELD

The disclosure relates to a method and an apparatus for determining the size of a transport block in a communication or broadcasting system.

BACKGROUND ART

In order to meet wireless data traffic demands that have increased after 4G communication system commercialization, efforts to develop an improved 5G communication system or a pre-5G communication system have been made. For this reason, the 5G communication system or the pre-5G communication system is called a beyond 4G network communication system or a post LTE system.

In order to achieve a high data transmission rate, an implementation of the 5G communication system in a mmWave band (for example, 60 GHz band) is being considered. In the 5G communication system, technologies such as beamforming, massive MIMO, Full Dimensional MIMO (FD-MIMO), array antenna, analog beam-forming, and large scale antenna are being discussed as means to mitigate a propagation path loss in the mm Wave band and increase a propagation transmission distance.

Further, the 5G communication system has developed technologies such as an evolved small cell, an advanced small cell, a cloud Radio Access Network (RAN), an ultra-dense network, Device to Device communication (D2D), a wireless backhaul, a moving network, cooperative communication, Coordinated Multi-Points (CoMP), and received interference cancellation to improve the system network.

In addition, the 5G system has developed Advanced Coding Modulation (ACM) schemes such as Hybrid FSK and QAM Modulation (FQAM) and Sliding Window Superposition Coding (SWSC), and advanced access technologies such as Filter Bank Multi Carrier (FBMC), Non Orthogonal Multiple Access (NOMA), and Sparse Code Multiple Access (SCMA).

Meanwhile, the Internet has been evolved to an Internet of Things (IoT) network in which distributed components such as objects exchange and process information from a human-oriented connection network in which humans generate and consume information. An Internet of Everything (IoE) technology in which a big data processing technology through a connection with a cloud server or the like is combined with the IoT technology has emerged. In order to implement IoT, technical factors such as a sensing technique, wired/wireless communication, network infrastructure, service-interface technology, and security technology are required, and research on technologies such as a sensor network, Machine-to-Machine (M2M) communication, Machine-Type Communication (MTC), and the like for connection between objects has recently been conducted. In an IoT environment, through collection and analysis of data generated in connected objects, an intelligent Internet Technology (IT) service to create a new value for peoples' lives may be provided. The IoT may be applied to fields, such as a smart home, smart building, smart city, smart car, connected car, smart grid, health care, smart home appliance, or high-tech medical service, through the convergence of the conventional Information Technology (IT) and various industries.

Accordingly, various attempts to apply the 5G communication to the IoT network are made. For example, the 5G communication technology, such as a sensor network, machine-to-machine (M2M) communication, and machine-type communication (MTC), has been implemented by a technique, such as beamforming, MIMO, and array antennas. The application of a cloud RAN as the big data processing technology may be an example of convergence of the 5G technology and the IoT technology.

In a communication and broadcasting system, link performance may significantly deteriorate due to various kinds of channel noise, a fading phenomenon, and inter-symbol interference (ISI). Accordingly, in order to realize high-speed digital communication and broadcasting systems that require high data throughput and high reliability such as those for next-generation mobile communication, digital broadcasting, and the mobile Internet, it is necessary to develop a technology for removing noise, fading, and inter-symbol interference. As research on noise removal, research on error correcting code has been actively conducted recently with the goal of realizing a method of increasing reliability of communication by efficiently reconstructing distortion of information.

DISCLOSURE OF INVENTION

Technical Problem

The disclosure provides a method and an apparatus for determining a transport block size (TBS), which is the size of a transport block (TB) through which data can be efficiently transmitted using a characteristic of a low-density parity-check (LDPC) code.

Solution to Problem

In accordance with an aspect of the disclosure, a method of identifying a transport block size (TBS) by a terminal in a wireless communication system is provided. The method includes: receiving control information for scheduling from a base station; identifying a number of temporary information bits, based on the control information for scheduling; identifying the TBS, based on the control information for scheduling and the number of temporary information bits; and decoding received downlink data, based on the identified TBS, wherein the TBS is a multiple of both 8 and a number of temporary code blocks (CBs) identified based on the control information for scheduling.

If a code rate identified based on scheduling information is equal to or smaller than 0.25 and the number of temporary information bits is N, the number of temporary CBs may be identified based on $$\left\lceil \frac{N+24}{3816} \right\rceil,$$

if a code rate identified based on scheduling information is larger than 0.25, and the number of temporary information bits is N larger than 8424, the number of temporary CBs may be identified based on $$\left\lceil \frac{N+24}{8424} \right\rceil,$$

and if the number of temporary information bits is equal to or smaller than 8424, the number of temporary CBs may be 1.

In accordance with another aspect of the disclosure, a method of identifying a transport block size (TBS) by a base station in a wireless communication system is provided. The method includes: identifying control information for scheduling; transmitting the control information for scheduling to a terminal; identifying a number of temporary information bits, based on the control information for scheduling; identifying the TBS, based on the control information for scheduling and the number of temporary information bits; and transmitting downlink data, based on the identified TBS, wherein the TBS is a multiple of both 8 and a number of temporary code blocks (CBs) identified based on the control information for scheduling.

In accordance with another aspect of the disclosure, a terminal for identifying a transport block size (TBS) in a wireless communication system is provided. The terminal includes: a transceiver; and a controller configured to perform control to receive control information for scheduling from a base station, identify a number of temporary information bits, based on the control information for scheduling, identify the TBS, based on the control information for scheduling and the number of temporary information bits, and decode received downlink data, based on the identified TBS, the controller being connected to the transceiver, wherein the TBS is a multiple of both 8 and a number of temporary code blocks (CBs) identified based on the control information for scheduling.

Advantageous Effects of Invention

The disclosure provides a method and an apparatus for determining a TBS, which is the size of a TB, by minimizing the addition of unnecessary bits using a characteristic of an LDPC code, allocated resources, and a code rate, thereby efficiently transmitting and receiving data.

MODE FOR THE INVENTION

Figure 1:
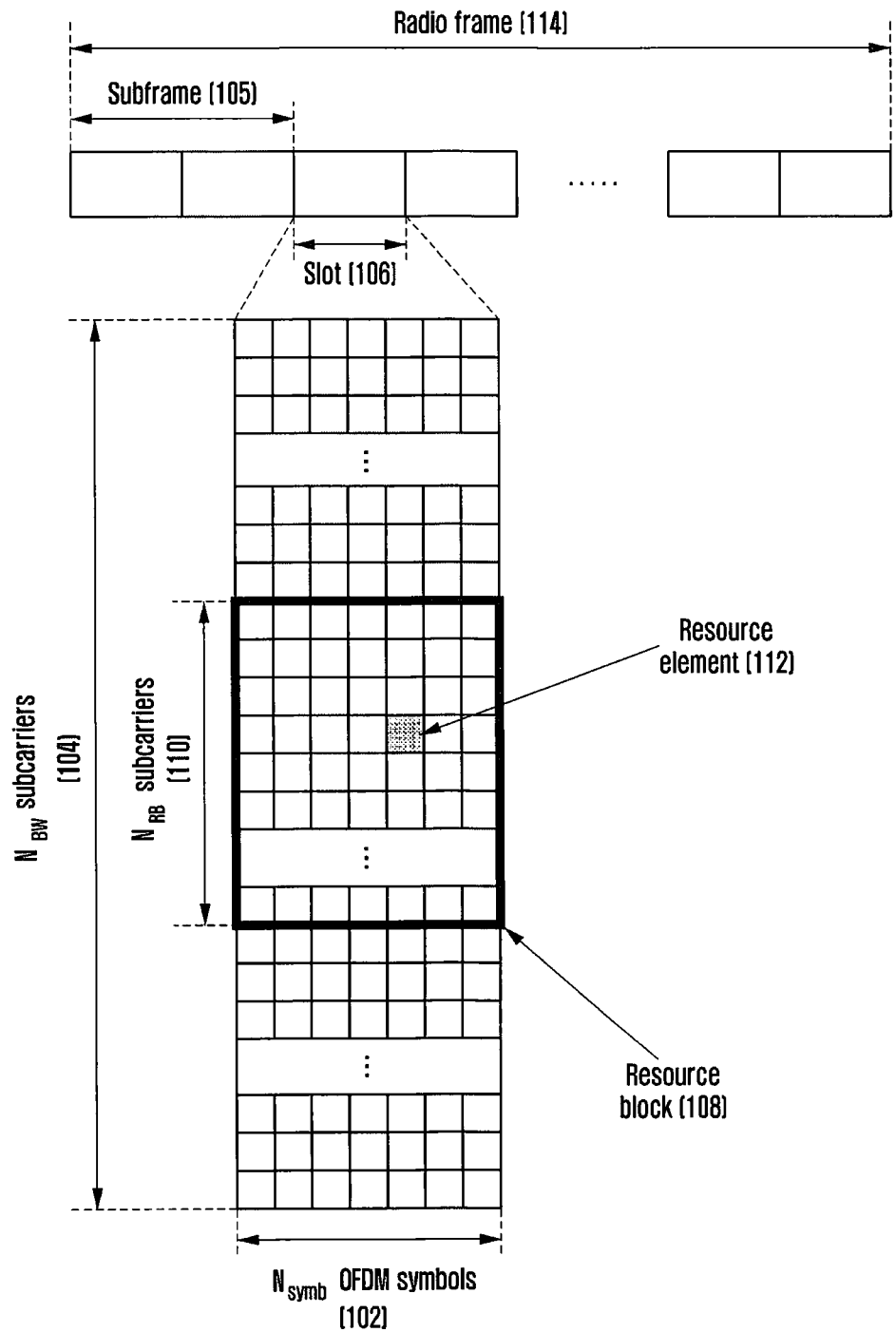
FIG. 1 illustrates the structure of transmission in downlink time-frequency domains of an LTE or LTE-A system.

Hereinafter, embodiments of the disclosure will be described in detail with reference to the accompanying drawings.

In describing the exemplary embodiments of the disclosure, descriptions related to technical contents which are well-known in the art to which the disclosure pertains, and are not directly associated with the disclosure, will be omitted. Such an omission of unnecessary descriptions is intended to prevent obscuring of the main idea of the disclosure and more clearly transfer the main idea.

For the same reason, in the accompanying drawings, some elements may be exaggerated, omitted, or schematically illustrated. Further, the size of each element does not entirely reflect the actual size. In the drawings, identical or corresponding elements are provided with identical reference numerals.

The advantages and features of the disclosure and methods of achieving the same will be apparent by referring to embodiments of the disclosure as described below in detail in conjunction with the accompanying drawings. However, the disclosure is not limited to the embodiments set forth below, but may be implemented in various different forms. The following embodiments are provided only to completely disclose the disclosure and inform those skilled in the art of the scope of the disclosure, and the disclosure is defined only by the scope of the appended claims. Throughout the specification, the same or like reference numerals designate the same or like elements.

Here, it will be understood that each block of the flowchart illustrations, and combinations of blocks in the flowchart illustrations, can be implemented by computer program instructions. These computer program instructions can be provided to a processor of a general purpose computer, special purpose computer, or other programmable data processing apparatus to produce a machine, such that the instructions, which execute via the processor of the computer or other programmable data processing apparatus, create means for implementing the functions specified in the flowchart block or blocks. These computer program instructions may also be stored in a computer usable or computer-readable memory that can direct a computer or other programmable data processing apparatus to function in a particular manner, such that the instructions stored in the computer usable or computer-readable memory produce an article of manufacture including instruction means that implement the function specified in the flowchart block or blocks. The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specified in the flowchart block or blocks.

And each block of the flowchart illustrations may represent a module, segment, or portion of code, which includes one or more executable instructions for implementing the specified logical function(s). It should also be noted that in some alternative implementations, the functions noted in the blocks may occur out of the order. For example, two blocks shown in succession may in fact be executed substantially concurrently or the blocks may sometimes be executed in the reverse order, depending upon the functionality involved.

As used herein, the "unit" refers to a software element or a hardware element, such as a Field Programmable Gate Array (FPGA) or an Application Specific Integrated Circuit (ASIC), which performs a predetermined function. However, the "unit does not always have a meaning limited to software or hardware. The "unit" may be constructed either to be stored in an addressable storage medium or to execute one or more processors. Therefore, the "unit" includes, for example, software elements, object-oriented software elements, class elements or task elements, processes, functions, properties, procedures, sub-routines, segments of a program code, drivers, firmware, micro-codes, circuits, data, database, data structures, tables, arrays, and parameters. The elements and functions provided by the "unit" may be either combined into a smaller number of elements, "unit" or divided into a larger number of elements, "unit". Moreover, the elements and "units" may be implemented to reproduce one or more CPUs within a device or a security multimedia card. Also, in an embodiment, "unit" may include one or more processors.

A wireless communication system has developed to be a broadband wireless communication system that provides a high speed and high quality packet data service, like the communication standards, for example, High Speed Packet Access (HSPA) of 3GPP, Long Term Evolution (LTE) or evolved universal terrestrial radio access (E-UTRA), LTE-advanced (LTE-A), High Rate Packet Data (HRPD) of 3GPP2, Ultra Mobile Broadband (UMB), and 802.16e of IEEE, or the like, beyond the voice-based service provided at the initial stage. Also, communication standard of 5G or new radio (NR) is being developed as a 5G wireless communication system.

Hereinafter, an embodiment of the disclosure will be described in detail with reference to the accompanying drawings. In the following description of the disclosure, a detailed description of known functions or configurations incorporated herein will be omitted when it may make the subject matter of the disclosure rather unclear. The terms which will be described below are terms defined in consideration of the functions in the disclosure, and may be different according to users, intentions of the users, or customs. Therefore, the definitions of the terms should be made based on the contents throughout the specification.

Hereinafter, a base station (BS) is the entity that allocates resources to a terminal, and may be at least one of a gNode B, an eNode B, a Node B, a radio access unit, an base station controller, and a node on a network. A terminal may include a user equipment (UE), a mobile station (MS), a cellular phone, a smart phone, a computer, or a multimedia system capable of performing a communication function. In the disclosure, a downlink (DL) refers to a wireless transmission path of a signal that the base station transmits to the terminal, and an uplink (UL) refers to a wireless transmission path of a signal that the terminal transmits to the base station.

Hereinafter, an embodiment of the disclosure is described on the basis of an LTE or LTE-A system (hereinafter, referred to as an LTE system) by way of example, but the embodiment of the disclosure can be applied to other communication systems having a similar background or channel form. For example, 5th-generation mobile communication technology (5G, new radio, and NR), developed after LTE-A, may be included therein. Embodiments of the disclosure can be applied to other communication systems through some modifications without departing from the scope of the disclosure on the basis of a determination by those skilled in the art.

An LTE system, which is a representative example of a broadband wireless communication system, employs an orthogonal frequency-division multiplexing (OFDM) scheme for a downlink (DL) and employs a single-carrier frequency-division multiple access (SC-FDMA) scheme for an uplink (UL). In the multiple access schemes as described above, time-frequency resources for carrying data or control information are allocated and operated in a manner to prevent overlapping of the resources, that is, to establish orthogonality between users so as to identify data or control information of each user.

When decoding fails in initial transmission, the LTE system employs hybrid automatic repeat request (HARQ) that retransmits the corresponding data in a physical layer. In the HARQ scheme, if a receiver does not accurately decode data, the receiver transmits information (negative acknowledgement: NACK) informing the transmitter of decoding failure, and thus the transmitter may re-transmit the corresponding data on the physical layer. The receiver increases data reception performance by combining the data re-transmitted by the transmitter with the data of which decoding failed. Also, if the receiver accurately decodes data, the receiver transmits information (acknowledgement: ACK) reporting that decoding was successfully executed, so that the transmitter transmits new data.

FIG. 1 illustrates the basic structure of time-frequency domains, which are downlink radio resource domains in the LTE system.

In FIG. 1, the horizontal axis indicates a time domain and the vertical axis indicates a frequency domain. A minimum transmission unit in the time domain is an OFDM symbol. One slot 106 consists of $N_{symb}$ OFDM symbols 102 and one subframe 105 consists of 2 slots. The length of one slot is 0.5 ins, and the length of one subframe is 1.0 ms. A radio frame 114 is a time-domain interval consisting of 10 subframes. In the frequency domain, the minimum transmission unit is a subcarrier. The bandwidth of the entire system transmission band consists of a total of $N_{BW}$ subcarriers 104.

A basic unit of resources in the time-frequency domains is a resource element (RE) 112, and may be indicated by an OFDM symbol index and a subcarrier index. A resource block (RB or physical resource block (PRB)) 108 is defined by $N_{symb}$ successive OFDM symbols 102 in the tune domain and $N_{RB}$ successive subcarriers 110 in the frequency domain. Therefore, one RB 108 includes $N_{symb} \times N_{RB}$ REs 112. In general, the minimum transmission unit of data is the RB unit. In the LTE system, generally, $N_{symb}=7$ and $N_{RB}=12$. $N_{RB}$ is proportional to a system transmission bandwidth. The data rate increases in proportion to the number of RBs scheduled in the terminal.

In the LTE system, 6 transmission bandwidths are defined and operated. In the case of a frequency-division duplexing (FDD) system, in which the downlink and the uplink are divided by frequency, a downlink transmission bandwidth and an uplink transmission bandwidth may be different from each other. A channel bandwidth may indicate an RF bandwidth, corresponding to a system transmission bandwidth. [Table 1] provided below indicates the relationship between a system transmission bandwidth and a channel bandwidth defined in the LTE system. For example, when the LTE system has a channel bandwidth of 10 MHz, the transmission bandwidth may include 50 RBs.

TABLE 1

| Channel bandwidth $BW_{channel}$ [MHz] | 1.4 | 3 | 5 | 10 | 15 | 20 |
|---|---|---|---|---|---|---|
| Transmission bandwidth configuration $N_{RB}$ | 6 | 15 | 25 | 50 | 75 | 100 |

Downlink control information (DCI) is transmitted within the first N OFDM symbols in the subframe. Generally, N={1, 2, 3}. Accordingly, N varies in every subframe depending on the amount of control information that should be transmitted in the current subframe. The control information includes a control channel transmission interval indicator indicating how many OFDM symbols are used for transmitting the control information, scheduling information of downlink data or uplink data, and HARQ ACK/NACK signals.

In the LTE system, scheduling information of downlink data or uplink data is transmitted from the base station to the terminal through downlink control information. The DCI is defined in various formats. The determined DCI format is applied and operated according to whether the DCI is scheduling information (UL grant) for uplink data or scheduling information (DL grant) for downlink data, whether the DCI is compact DCI having small-sized control information, whether the DCI applies spatial multiplexing using multiple antennas, and whether the DCI is DCI for controlling power. For example, DCI format 1 indicating scheduling control information (DL grant) for downlink data is configured to include at least one piece of the following control information.

Resource allocation Type 0/1 flag: indicates whether a resource allocation type is Type 0 or Type 1. Type 0 applies a bitmap scheme and allocates resources in units of resource block groups (RBGs). In the LTE system, a basic scheduling unit is a resource block (RB), expressed by time and frequency domain resources, and an RBG includes a plurality of RBs and is used as a basic scheduling unit in the Type 0 scheme. Type 1 allows allocation of a predetermined RB in an RBG.

Resource block assignment: indicates RBs allocated to data transmission. Expressed resources are determined according to the system bandwidth and the resource allocation type.

Modulation and coding scheme (MCS): indicates the modulation scheme used for data transmission and the size of a transport block (TB), which is data to be transmitted.

HARQ process number: indicates a process number of HARQ.

New data indicator: indicates HARQ initial transmission or HARQ retransmission.

Redundancy version (RV): indicates a redundancy version of HARQ.

Transmit power control (TPC) command for physical uplink control channel (PUCCH): indicates a transmission power control command for a PUCCH, which is an uplink control channel.

The DCI is transmitted through a physical downlink control channel (PDCCH) or an enhanced PDCCH (EPDCCH), which is a downlink physical control channel, via a channel-coding and modulation process. Hereinafter, PDCCH transmission/reception or EPDCCH transmission/reception may be understood as DCI transmission/reception on the PDCCH or the EPDCCH. Hereinafter, such a technology can be applied to other channels.

Generally, the DCI is scrambled with a specific radio network temporary identifier (RNTI) (or a terminal identifier), independently for each terminal, a cyclic redundancy check (CRC) is added, and channel coding is performed, whereby each independent PDCCH is configured and transmitted. In the time region, the PDCCH is mapped and transmitted during the control channel transmission interval. The mapping location of the PDCCH in the frequency domain is determined by the identifier (ID) of each terminal, and is propagated to the entire system transmission band.

Downlink data is transmitted through a physical downlink shared channel (PDSCH), which is a physical downlink data channel. The PDSCH is transmitted after the control channel transmission interval, and the detailed mapping location in the frequency region and scheduling information such as the modulation scheme are made known through DCI transmitted through the PDCCH.

Via an MCS formed of 5 bits in the control information included in the DCI, the base station may report the modulation scheme applied to a PDSCH to be transmitted to the terminal and the size (transport block size (TBS)) of data to be transmitted. The TBS corresponds to the size before channel coding for error correction is applied to the data (that is, the transport block) to be transmitted by the base station.

The modulation scheme supported by the LTE system includes quadrature phase-shift keying (QPSK), 16 quadrature amplitude modulation (16QAM), and 64QAM. Modulation orders correspond to 2, 4, and 6 respectively. That is, the base station may transmit 2 bits per symbol in the QPSK modulation, 4 bits per symbol in the 16QAM, and 6 bits per symbol in the 64QAM.

Figure 2:
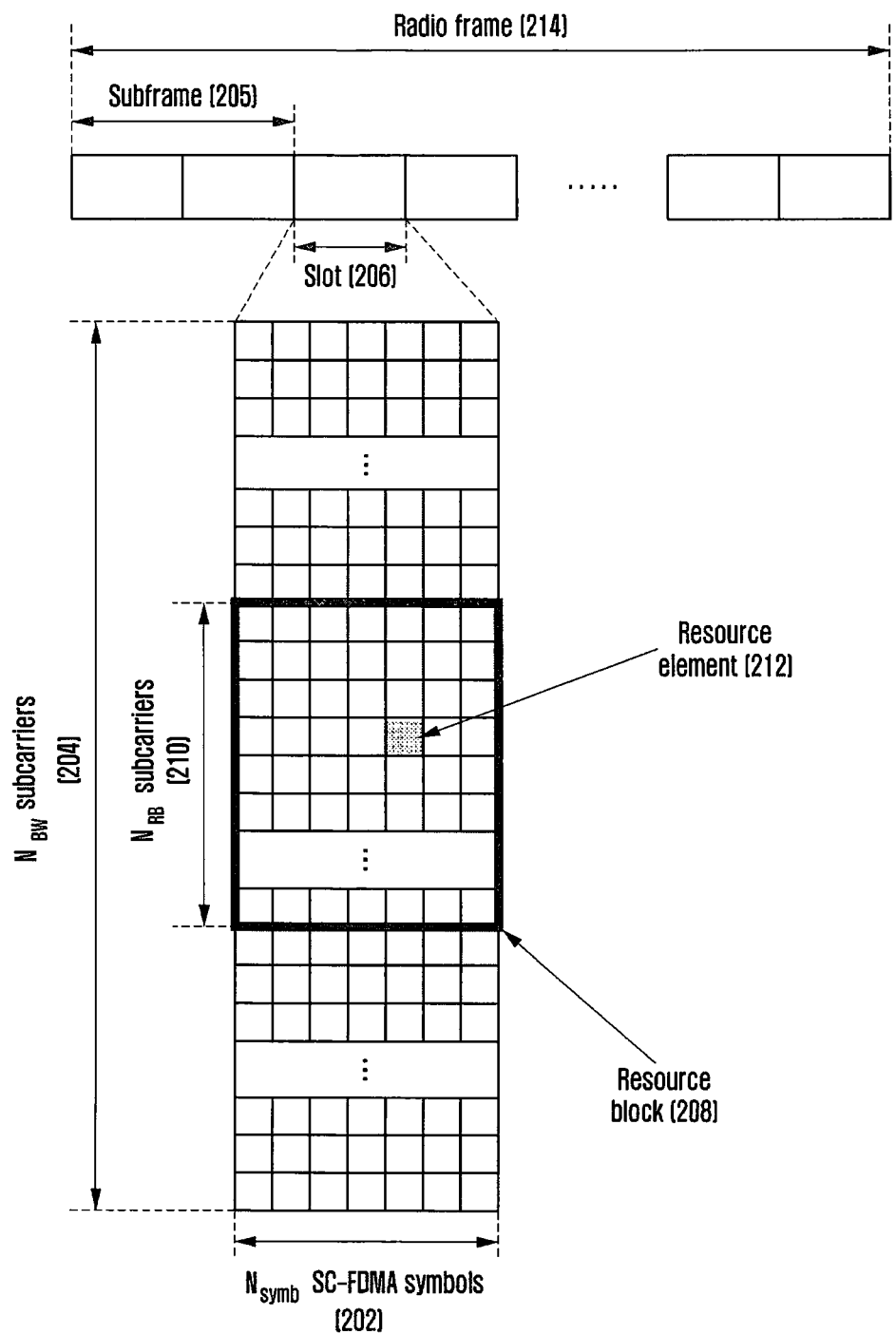
FIG. 2 illustrates the structure of transmission in uplink time-frequency domains of the LTE or LTE-A system.

FIG. 2 illustrates the basic structure of time-frequency domains, which are uplink radio resource domains in the LTE system.

Referring to FIG. 2, the horizontal axis indicates the time domain and the vertical axis indicates the frequency domain. A minimum transmission unit in the time domain is an SC-FDMA symbol, and one slot 206 consists of $N_{symb}$ SC-FDMA symbols 202. One subframe 205 includes two slots. A minimum transmission unit in the frequency domain is a subcarrier, and an entire system transmission band (transmission bandwidth) consists of a total of New subcarriers 204. $N_{BW}$ has a value proportional to a system transmission bandwidth.

The basic unit of resources in the time-frequency domains is a resource element (RE) 212, and may be defined by an SC-FDMA symbol index and a subcarrier index. A resource block (RB) 208 is defined by $N_{symb}$ successive SC-FDMA symbols in the time domain and $N_{RB}$ successive subcarriers in the frequency domain. Accordingly, one RB consists of $N_{symb} \times N_{RB}$ REs. In general, a minimum transmission unit of data or control information is an RB. A PUCCH is mapped to a frequency domain corresponding to 1 RB, and may be transmitted during 1 subframe.

In the LTE system, a timing relationship of a PUCCH or a physical uplink shared channel (PUSCH), which is an uplink physical channel through which HARQ ACK/NACK is transmitted, is defined, wherein the HARQ ACK/NACK corresponds to a PDSCH, which is a physical channel for downlink data transmission or a PDCCH or an EPDCCH including a semi-persistent scheduling release (SPS release). For example, in the LTE system operating in an FDD manner, HARQ ACK/NACK corresponding to a PDSCH transmitted in an (n−4)th subframe or a PDCCH or an EPDCCH including SRS release is transmitted to a PUCCH or a PUSCH in an nth subframe.

In the LTE system, downlink HARQ adopts an asynchronous HARQ scheme, in which the time point at which data is retransmitted is not fixed. That is, if the base station receives a HARQ NACK feedback of data that the base station initially transmitted from the terminal, the base station freely determines the time point at which the retransmitted data is to be transmitted via a scheduling operation. For the HARQ operation, the terminal buffers data which is determined to be erroneous on the basis of the result of decoding the received data, and then combines the data with subsequently retransmitted data.

If the terminal receives a PDSCH including downlink data transmitted from the base station through subframe n, the terminal transmits uplink control information including HARQ ACK or NACK of the downlink data to the base station through a PUCCH or a PUSCH in subframe n+k. In this instance, k is defined differently according to whether the LTE system adopts FDD or time-division duplexing (TDD) and the subframe configuration thereof. For example, in the case of the FDD LTE system, k is fixed to 4. Meanwhile, in the case of the TDD LTE system, k may be changed according to a subframe configuration and a subframe number.

Unlike the downlink HARQ, uplink HARQ adopts a synchronous HARQ scheme in which a time point at which data is transmitted is fixed in the LTE system. That is, the uplink/downlink timing relationship between a PUSCH, which is a physical channel for uplink data transmission, a PDCCH, which is a preceding downlink control channel, and a PHICH, which is a physical channel for transmitting downlink HARQ ACK/NACK corresponding to the PUSCH, is fixed by the following rule.

If the terminal receives a PDCCH including uplink scheduling control information transmitted from the base station or a PHICH for transmitting downlink HARQ ACK/NACK in subframe n, the terminal transmits uplink data corresponding to the control information through a PUSCH in subframe n+k. At this time, k is defined differently depending on whether the LTE system adopts FDD or TDD and the configuration thereof. For example, in the case of the FDD LTE system, k is fixed to 4. Meanwhile, in the case of the TDD LTE system, k may be changed according to a subframe configuration and a subframe number.

Further, if the terminal receives a PHICH carrying downlink HARQ ACK/NACK from the base station in subframe i, the PHICH corresponds to a PUSCH transmitted by the terminal in subframe (i-k). At this time, k is defined differently depending on whether the LTE system adopts FDD or TDD and the configuration thereof. For example, in the case of the FDD LTE system, k is fixed to 4. Meanwhile, in the case of the TDD LTE system, k may be changed according to a subframe configuration and a subframe number.

Further, when data is transmitted through a plurality of carriers, k may be applied differently depending on the TDD configuration of each carrier.

TABLE 2

| Transmission mode | DCI format | Search Space | Transmission scheme of PDSCH corresponding to PDCCH |
|---|---|---|---|
| Mode 1 | DCI format 1A | Common and UE-specific by C-RNTI | Single-antenna port, port 0 (see subclause 7.1.1) |
| Mode 2 | DCI format 1 | UE-specific by C-RNTI | Single-antenna port, port 0 (see subclause 7.1.1) |
|  | DCI format 1A | Common and UE-specific by C-RNTI | Transmit diversity (see subclause 7.1.2) |
| Mode 3 | DCI format 1 | UE-specific by C-RNTI | Transmit diversity (see subclause 7.1.2) |
|  | DCI format 1A | Common and UE-specific by C-RNTI | Transmit diversity (see subclause 7.1.2) |
|  | DCI format 2A | UE-specific by C-RNTI | Large delay CDD (see subclause 7.1.3) or Transmit diversity (see subclause 7.1.2) |
| Mode 4 | DCI format 1A | Common and UE-specific by C-RNTI | Transmit diversity (see subclause 7.1.2) |
|  | DCI format 2 | UE-specific by C-RNTI | Closed-loop spatial multiplexing (see subclause 7.1.4) or Transmit diversity (see subclause 7.1.2) |
| Mode 5 | DCI format 1A | Common and UE-specific by C-RNTI | Transmit diversity (see subclause 7.1.2) |
|  | DCI format 1D | UE-specific by C-RNTI | Multi-user MIMO (see subclause 7.1.5) |
| Mode 6 | DCI format 1A | Common and UE-specific by C-RNTI | Transmit diversity (see subclause 7.1.2) |
|  | DCI format 1B | UE-specific by C-RNTI | Closed-loop spatial multiplexing (see subclause 7.1.4) using a single transmission layer |
| Mode 7 | DCI format 1A | Common and UE-specific by C-RNTI | If the number of PBCH antenna ports is one, Single-antenna port, port 0 is used (see subclause 7.1.1), otherwise Transmit diversity (see subclause 7.1.2) |
|  | DCI format 1 | UE-specific by C-RNTI | Single-antenna port, port 5 (see subclause 7.1.1) |
| Mode 8 | DCI format 1A | Common and UE-specific by C-RNTI | If the number of PBCH antenna ports is one, Single-antenna port, port 0 is used (see subclause 7.1.1), otherwise Transmit diversity (see subclause 7.1.2) |
|  | DCI format 2B | UE-specific by C-RNTI | Dual-layer transmission, port 7 and 8 (see subclause 7.1.5A) or single-antenna port, port 7 or 8 (see subclause 7.1.1) |

[Table 2] above shows supportable DCI formats according to each transmission mode in a condition set by a C-RNTI in 3GPP TS 36.213. The terminal assumes the existence of the corresponding DCI format in a control area interval according to a preset transmission mode and performs a search and decoding. For example, if transmission mode 8 is indicated to the terminal, the terminal searches for DCI format 1A in a common search space and a UE-specific search space and searches for DCI format 2B only in the UE-specific search space.

The description of the wireless communication system is provided from the perspective of an LTE system, but the disclosure is not limited to the LTE system and may be applicable to various wireless communication systems such as NR, 5G, or the like. Further, if the present embodiment is applied to other wireless communication systems, k may be changed and applied to a system using a modulation scheme corresponding to FDD.

The disclosure provides a method and an apparatus for transmitting a coding bit which may support various input lengths and code rates. Further, the disclosure provides a method of configuring a base graph of an LDPC code used for data channel transmission and a method and an apparatus for segmenting a transport block (TB) using the LDPC code.

Subsequently, a low-density parity check (LDPC) code will be described.

The LDPC code is a type of linear block code, and a process of determining a codeword that satisfies a condition such as [Equation 1] below is included.

$$H \cdot c^T = [h_1 \; h_2 \; h_3 \; \ldots \; h_{N_{ldpc}-1}] \cdot c^T = \sum_{i=0}^{N_{ldpc}} c_i \cdot h_i \quad \text{[Equation 1]}$$

In [Equation 1], $$c = [c_0, c_1, c_2, \ldots, c_{N_{ldpc}-1}].$$

In [Equation 1], H denotes a parity check matrix, C denotes a codeword, $c_i$ denotes an ith bit of a codeword, and $N_{ldpc}$ denotes a codeword length. Here, $h_i$ denotes the ith column of the parity check matrix (H).

The parity check matrix H includes $N_{ldpc}$ columns, $N_{ldpc}$ being the same as the number of bits of the LDPC codeword. [Equation 1] means that the sum of the products of ith columns ($h_i$) of the parity check matrix and ith codeword bits $c_i$ is "0", so that the ith column ($h_i$) is associated with the ith codeword bit $c_i$.

For the parity check matrix used in communication and broadcasting systems, a quasi-cyclic LDPC code (or a QC-LDPC code, hereinafter, referred to as the QC-LDPC code) generally using a quasi-cyclic parity check matrix is frequently used for easy implementation.

The QC-LDPC code features a parity check matrix including a 0-matrix (zero matrix) having a square matrix form or a circulant permutation matrix.

As shown in [Equation 2] below, a permutation matrix $P=(P_{ij})$ having a size of Z×Z is defined.

$$P_{i,j} = \begin{cases} 1 & \text{if } i+1 \equiv j \bmod Z \\ 0 & \text{otherwise} \end{cases} \quad \text{[Equation 2]}$$

In [Equation 2], $P_{ij}$ (0≤i, j<Z) is an element (entry) in an ith row and a jth column in the matrix P. On the basis of 0≤i<Z for the permutation matrix described above, it may be noted that P is a circulant permutation matrix obtained by circularly shifting each element of an identity matrix having a size of Z×Z to the right by i.

The parity check matrix H of the simplest QC-LDPC code may be indicated as shown in [Table 3] below.

$$H = \begin{bmatrix} P^{a_{11}} & P^{a_{12}} & \ldots & P^{a_{1n}} \\ P^{a_{21}} & P^{a_{22}} & \ldots & P^{a_{2n}} \\ \vdots & \vdots & \ddots & \vdots \\ P^{a_{m1}} & P^{a_{m2}} & \ldots & P^{a_{mn}} \end{bmatrix} \quad \text{[Equation 3]}$$

If $P^{-1}$ is defined as a 0-matrix having a size of Z×Z, each exponent $a_{ij}$ of the circulant permutation matrix or the 0-matrix has one of the values {−1, 0, 1, 2, . . . , Z−1}.

Further, it may be noted that the parity check matrix H of [Equation 3] has a size of mZ×nZ since it has n column blocks and m row blocks.

In general, a binary matrix having a size of m×n, obtained by replacing the circulant permutation matrix and the 0-matrix in the parity check matrix of [Equation 3] with 1 and 0, is determined as a mother matrix (or a base graph) of the parity check matrix H, and a matrix of integers having the size of m×n obtained by selecting only exponents of the circulant permutation matrix or the 0-matrix as shown in [Equation 4] below is determined as an exponent matrix E(H) of the parity check matrix H.

$$E(H) = \begin{bmatrix} a_{11} & a_{12} & \ldots & a_{1n} \\ a_{21} & a_{22} & \ldots & a_{2n} \\ \vdots & \vdots & \ddots & \vdots \\ a_{m1} & a_{m2} & \ldots & a_{mn} \end{bmatrix} \quad \text{[Equation 4]}$$

Meanwhile, the performance of an LDPC code may be determined according to the parity check matrix. Accordingly, it is required to design an efficient parity check matrix for an LDPC code having excellent performance. Further, an LDPC encoding and decoding method that supports various input lengths and code rates is needed.

A method known as lifting is used for efficient design of the QC-LDPC code. Lifting is a method of efficiently designing a very large parity check matrix by configuring a Z value for determining the size of a circulant permutation matrix or a 0-matrix from a given small mother matrix according to a specific rule. The conventional lifting method and the characteristics of the QC-LDPC code designed through the lifting are briefly described below.

If an LDPC code $C_0$ is given, S QC-LDPC codes to be designed through the lifting method are $C_1, C_2, \ldots C_k, \ldots, C_S$ (similarly, $C_k$ for 1≤k≤S), a parity check matrix of the QC-LDPC code $C_k$ is $H_k$, and a value corresponding to the size of row blocks and column blocks of the circulant matrix included in the parity check matrix is $Z_k$. $C_0$ corresponds to the smallest LDPC code having a mother matrix of $C_1, \ldots,$ and $C_S$ codes as a parity check matrix, a $Z_0$ value corresponding to the size of row blocks and column blocks is 1, and $Z_k < Z_k+1$ for 0≤k≤S−1. For convenience, a parity check matrix $H_k$ of each code $C_k$ has an exponent matrix $E(H_k) = a_{i,j}^{(k)}$ having a size of m×n, and one of the values {−1, 0, 1, 2, . . . , $Z_k$−1} is selected as each exponent $a_{i,j}^{(k)}$. The lifting includes steps of $C_0 \rightarrow C_1 \rightarrow \ldots \rightarrow C_S$ and features $Z_{k+1} = q_{k+1} Z_k$ ($q_{k+1}$ is a positive integer, k=0, 1, . . . , S−1). If only the parity check matrix $H_S$ of the $C_S$ is stored due to the characteristics of the lifting process, all the QC-LDPC codes $C_0, C_1, \ldots, C_S$ can be indicated using [Equation 5] or [Equation 6] below according to the lifting method.

$$E(H_k) \equiv \left\lfloor \frac{Z_k}{Z_S} E(H_S) \right\rfloor \quad \text{[Equation 5]}$$

$$E(H_k) \equiv E(H_S) \bmod Z_k \quad \text{[Equation 6]}$$

[Equation 7] is the most generalized expression of the method.

$$P_{i,j} = f(V_{i,j}, Z) \quad \text{[Equation 7]}$$

In [Equation 7], f(x,y) is a predetermined function having x and y as input values. $V_{i,j}$ is an element corresponding to an ith row and a jth column of an exponent matrix of the parity check matrix corresponding to the largest LDPC code (for example, corresponding to the $C_S$ in the above description). $P_{ij}$ is an element corresponding to an ith row and a $j^{th}$ column of an exponent matrix of the parity check matrix corresponding to the LDPC code having a predetermined size (for example, corresponding to the $C_k$ in the above description), and Z is the size of row blocks and column blocks of the circulant matrix included in the parity check matrix of the corresponding LDPC code. Accordingly, if $V_{i,j}$ is defined, a parity check matrix for an LDPC code having a predetermined size can be defined.

In a description of the disclosure to be provided later, the above-described symbols are named, defined, and used as follows.

[Definition 1]

$E(H_S)$: maximum exponent matrix $V_{i,j}$: maximum exponent matrix element (corresponding to an $(i,j)^{th}$ element of $E(H_S)$)

A parity check matrix for a predetermined LDPC code may be indicated using the above-defined maximum exponent matrix or maximum exponent matrix element.

In a next-generation mobile communication system, there may be a plurality of maximum exponent matrixes defined above in order to guarantee the best performance of a code block having various lengths. For example, there may be M different maximum exponent matrices, which may be expressed as follows.

$$E(H_S)_1, E(H_S)_2, \ldots, E(H_S)_M \qquad [\text{Equation 8}]$$

There may be a plurality of maximum exponent matrix elements corresponding thereto, which may be expressed as follows.

$$(V_{i,j})_1, (V_{i,j})_2, \ldots, (V_{i,j})_M \qquad [\text{Equation 9}]$$

In [Equation 9], a maximum exponent matrix element $(V_{i,j})_m$ corresponds to $(i, j)$ of a maximum exponent matrix $E(H_S)_m$. Hereinafter, in the definition of the parity check matrix for the LDPC code, the above-defined maximum exponent matrix will be used and described. This may be applied in the same manner as the expression using the maximum exponent matrix element.

A turbo-code-based code block segmentation and CRC attachment method in a document of LTE TS 36.213 is cited below.

---

5.1.2 Code block segmentation and code block CRC attachment

The input bit sequence to the code block segmentation is denoted by $b_0, b_1, b_2, b_3, \ldots, b_{B-1}$,
where B > 0. If B is larger than the maximum code block size Z, segmentation of the input bit
sequence is performed and an additional CRC sequence of L = 24 bits is attached to each code
block. The maximum code block size is:
   Z = 6144.
If the number of filler bits F calculated below is not 0, filler bits are added to the beginning of
the first block.
   Note that if B < 40, filler bits are added to the beginning of the code block.
The filler bits shall be set to <NULL> at the input to the encoder.
Total number of code blocks C is determined by:
if B ≤ Z
   L = 0
   Number of code blocks: C = 1
   B' = B
else
   L = 24
   Number of code blocks: C = ⌈B/(Z − L)⌉.
   B' = B + C · L
end if
The bits output from code block segmentation, for C ≠ 0, are denoted by $c_{r0}, c_{r1}, c_{r2}, c_{r3}, \ldots, c_{r(K_r-1)}$, where r is the code block number, and $K_r$ is the number of bits for the code block number r.
   Number of bits in each code block (applicable for C ≠ 0 only):
   First segmentation size: $K_+$ = minimum K in table 5.1.3-3 such that C · K ≥ B'
      if C = 1
         the number of code blocks with length $K_+$ is $C_+$ = 1, $K_-$ = 0, $C_-$ = 0
      else if C > 1
         Second segmentation size: $K_-$ = maximum K in table 5.1.3-3 such that K < $K_+$
         $\Delta_K = K_+ − K_-$ Number of segments of size $K_-$: $C_- = \left\lfloor \dfrac{C \cdot K_+ - B'}{\Delta_K} \right\rfloor$.

Number of segments of size $K_+$: $C_+ = C - C_-$.
      end if
   Number of filler bits: $F = C_+ \cdot K_+ + C_- \cdot K_- - B'$
   for k = 0 to F − 1                                  Insertion of filler bits
      $c_{0k}$ = <NULL>
   end for
   k = F
   s = 0
   for r = 0 to C − 1
      if r < $C_-$
         $K_r = K_-$
      else
         $K_r = K_+$ -continued

| 5.1.2 Code block segmentation and code block CRC attachment |
|---|
| end if |
|   while k < $K_r$ − L |
|     $c_{rk} = b_s$ |
|     k = k + 1 |
|     s = s + 1 |
|   end while |
|   if C > 1 |
|     The sequence $c_{r0}, c_{r1}, c_{r2}, c_{r3}, \ldots, c_{r(K_r-L-1)}$ is used to calculate the CRC parity bits |
|     $p_{r0}, p_{r1}, p_{r2}, \ldots, p_{r(L-1)}$ according to section 5.1.1 with the generator polynomial |
|     $g_{CRC24B}(D)$. |
|     For CRC calculation it is assumed that filler bits, if present, have the value 0. |
|     while k < $K_r$ |
|       $c_{rk} = p_{r(k+L-K_r)}$ |
|       k = k + 1 |
|     end while |
|   end if |
|   k = 0 |
| end for |

5G and next-generation communication systems use the LDPC code in a data channel, unlike the LTE system. Even in the situation in which the LDPC code is applied, one transport block may be divided into a plurality of code blocks, and some code blocks thereof may form one code block group. Further, the numbers of code blocks of respective code block groups may be the same as each other or may have different values. Bit-unit interleaving may be applied to an individual code block, a code block group, or a transport block.

Figure 3:
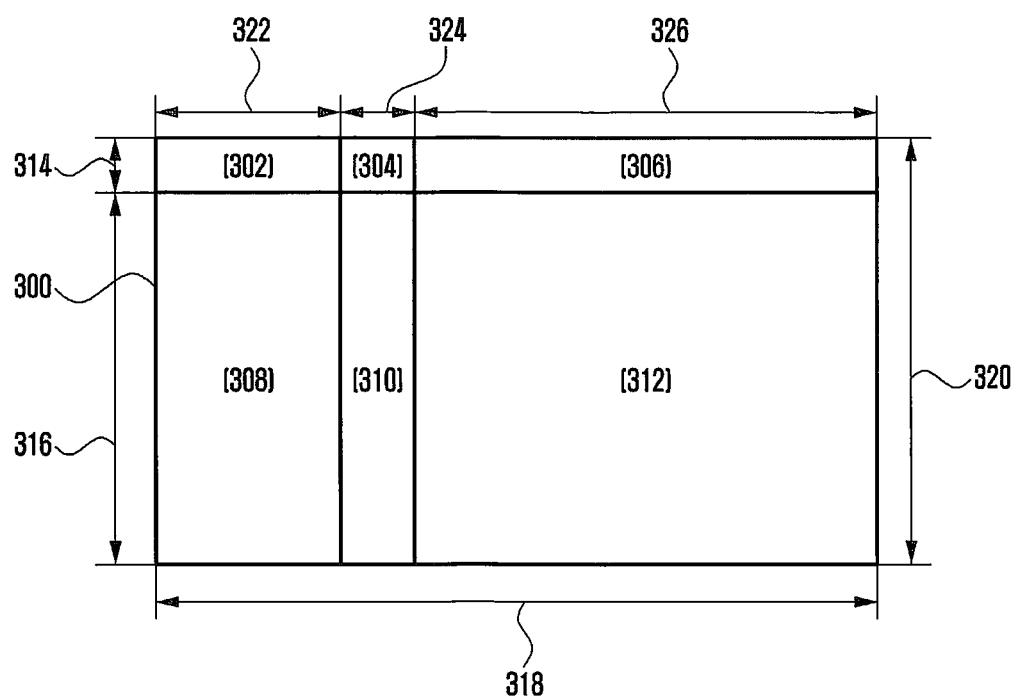
FIG. 3 illustrates a basic structure of a mother matrix (or a base graph) of the LDPC code.

FIG. 3 illustrates the basic structure of a mother matrix (or a base graph) of the LDPC code.

In FIG. 3, two basic structures of a base graph 300 of the LDPC code supporting data channel coding are basically supported by a next-generation mobile communication system. The first base graph structure of the LDPC code is a matrix structure having a maximum vertical length 320 of 46 and a maximum horizontal length 318 of 68, and the second base graph structure of the LDPC code is a matrix structure having a maximum vertical length 320 of 42 and a maximum horizontal length 318 of 52. The first base graph structure of the LPDC code may support a minimum of 1/3 code rate to a maximum of 8/9 code rate, and the second base graph structure of the LDPC may support a minimum of 1/5 code rate to a maximum of 8/9 code rate.

Basically, the LDPC code may include 6 sub matrix structures. A first sub matrix structure 302 includes system bits. A second sub matrix structure 304 is a square matrix and includes parity bits. A third sub matrix structure 306 is a zero matrix. A fourth sub matrix structure 308 and a fifth sub matrix structure 310 include parity bits. A sixth sub matrix structure 312 is a unit matrix.

In the first base graph structure of the LDPC code, a horizontal length 322 of the first sub matrix 302 has a value of 22 and a vertical length 314 has a value of 4 or 5. Both a horizontal length 324 and a vertical length 314 of the second sub matrix 304 have a value of 4 or 5. A horizontal length 326 of the third sub matrix 306 has a value of 42 or 41 and a vertical length 314 has a value of 4 or 5. A vertical length 316 of the fourth sub matrix 308 has a value of 42 or 41 and a horizontal length 322 has a value of 22. A horizontal length 324 of the fifth sub matrix 310 has a value of 4 or 5 and a vertical length 316 has a value of 42 or 41. Both a horizontal length 326 and a vertical length 316 of the sixth sub matrix 312 have a value of 42 or 31.

In the second base graph structure of the LDPC code, a horizontal length 322 of the first sub matrix 302 has a value of 10 and a vertical length 314 has a value of 7. Both a horizontal length 324 and a vertical length 314 of the second sub matrix 304 have a value of 7. A horizontal length 326 of the third sub matrix 306 has a value of 35 and a vertical length 314 has a value of 7. A vertical length 316 of the fourth sub matrix 308 has a value of 35 and a horizontal length 322 has a value of 10. A horizontal length 324 of the fifth sub matrix 310 has a value of 7 and a vertical length 316 has a value of 35. Both a horizontal length 326 and a vertical length 316 of the sixth sub matrix 312 have a value of 35.

In the first base graph structure of the LDPC code, one supportable code block size is 22×Z (Z=a×2j and Z is as shown in [Table 3] below. The maximum size of one supportable code block is 8448 and the minimum size of one supportable code block is 44. For reference, some or all of (272, 304, 336, 368) may be additionally reflected as candidates of Z in [Table 3]).

TABLE 3

| | | a | | | | | | |
|---|---|---|---|---|---|---|---|---|
| | Z | 2 | 3 | 5 | 7 | 9 | 11 | 13 | 15 |
| j | 0 | 2 | 3 | 5 | 7 | 9 | 11 | 13 | 15 |
| | 1 | 4 | 6 | 10 | 14 | 18 | 22 | 26 | 30 |
| | 2 | 8 | 12 | 20 | 28 | 36 | 44 | 52 | 60 |
| | 3 | 16 | 24 | 40 | 56 | 72 | 88 | 104 | 120 |
| | 4 | 32 | 48 | 80 | 112 | 144 | 176 | 208 | 240 |
| | 5 | 64 | 96 | 160 | 224 | 288 | 352 | | |
| | 6 | 128 | 192 | 320 | | | | | |
| | 7 | 256 | 384 | | | | | | |

In the first base graph structure of the LDPC code, the sizes of one supportable code block are as follows.

44, 66, 88, 110, 132, 154, 176, 198, 220, 242, 264, 286, 308, 330, 352, 296, 440, 484, 528, 572, 616, 660, 704, 792, 880, 968, 1056, 1144, 1232, 1320, 1408, 1584, 1760, 1936, 2112, 2288, 2464, 2640, 2816, 3168, 3520, 3872, 4224, 4576, 4928, 5280, 5632, 6336, 7040, 7744, 8448, (5984, 6688, 7392, 8096)

In the above sizes, (5984, 6688, 7392, 8096) may be additionally included.

A total of M maximum exponent matrices $E(H_S)_i^1$ are additionally defined on the basis of the first base graph of the LDPC code (BG #1). In general, M may have a value of 8 or a random natural value, and i has a value from 1 to M. The terminal performs downlink data decoding or uplink data encoding using the matrices $E(H_S)_i^1$. The matrices $E(H_S)_i^1$ have particular element values shifted from the first base graph of the LDPC code (BG #1). That is, the matrices $E(H_S)_i^1$ may have different shifted values.

In the first base graph structure of the LDPC code, one supportable code block size is 10×Z (Z=a×2j and Z is as shown in [Table 4] below. The maximum size of one supportable code block is 2560 (or 3840) and the minimum size of one supportable code block is 20. For reference, some or all of (288, 272, 304, 320, 336, 352, 368, 384) may be additionally reflected as candidates of Z in [Table 4]).

TABLE 4

| | | a | | | | | | |
|---|---|---|---|---|---|---|---|---|
| | Z | 2 | 3 | 5 | 7 | 9 | 11 | 13 | 15 |
| j | 0 | 2 | 3 | 5 | 7 | 9 | 11 | 13 | 15 |
| | 1 | 4 | 6 | 10 | 14 | 18 | 22 | 26 | 30 |
| | 2 | 8 | 12 | 20 | 28 | 36 | 44 | 52 | 60 |
| | 3 | 16 | 24 | 40 | 56 | 72 | 88 | 104 | 120 |
| | 4 | 32 | 48 | 80 | 112 | 144 | 176 | 208 | 240 |
| | 5 | 64 | 96 | 160 | 224 | | | | |
| | 6 | 128 | 192 | | | | | | |
| | 7 | 256 | | | | | | | |

In the second base graph structure of the LDPC code, the sizes of one supportable code block are as follows. 20, 30, 40, 50, 60, 70, 80, 90, 100, 110, 120, 130, 140, 150, 160, 180, 200, 220, 240, 260, 280, 300, 320, 360, 400, 440, 480, 520, 560, 600, 640, 720, 800, 880, 960, 1040, 1120, 1200, 1280, 1440, 1600, 1760, 1920, 2080, 2240, 2400, 2560 (2880, 3200, 3520, 3840, 2720, 3040, 3360, 3680)

In the above sizes, (2880, 3200, 3520, 3840, 2720, 3040, 3360, 3680) are values that may be additionally included.

A total of M maximum exponent matrices $E(H_S)_i^2$ are additionally defined on the basis of the second base graph of the LDPC code (BG #2). In general, M may have a value of 8 or a random natural value, and i may have a value from 1 to M. The terminal performs downlink data decoding or uplink data encoding using the matrices $E(H_S)_i^2$. The matrices $E(H_S)_i^2$ have particular element values shifted from the second base graph of the LDPC code (BG #2). That is, the matrices $E(H_S)_i^2$ may have different shift values.

As described above, the two types of base graphs are provided in the next-generation mobile communication system. Accordingly, particular terminals may support only the first base graph or the second base graph, or there may be terminals supporting both base graphs. They are listed as shown in [Table 5] below.

TABLE 5

| Terminal type | Supportable operation |
|---|---|
| Type 1 | Support only first base graph or support maximum exponent matrix $E(Hs)^1i$ |
| Type 2 | Support only second base graph or support maximum exponent matrix $E(Hs)^2i$ |
| Type 3 | Support both base graphs or support maximum exponent matrices $E(Hs)^1i$ and $E(Hs)^2i$ |

When receiving downlink data information through downlink control information from the base station, the terminal supporting Type 1 determines that a base graph applied to a transport block including the downlink data information is always the first base graph and applies the maximum exponent matrix $E(H_S)_i^2$ to data encoding or decoding. When receiving downlink data information through downlink control information from the base station, the terminal supporting type 2 determines that a base graph applied to a transport block including the downlink data information is always the second base graph and applies the maximum exponent matrix $E(H_S)_i^2$ to data encoding or decoding. When receiving downlink data information through downlink control information from the base station, the terminal supporting type 3 receives, in advance, the configuration of a base graph applied to a transport block including the downlink data information from the base station through higher-layer signaling such as SIB, RRC, or MAC CE or through downlink control information transmitted in a UE-group-common, UE (cell)-common or UE-specific control channel. The downlink control information may be included together with transport block scheduling information or alone.

Figure 4:
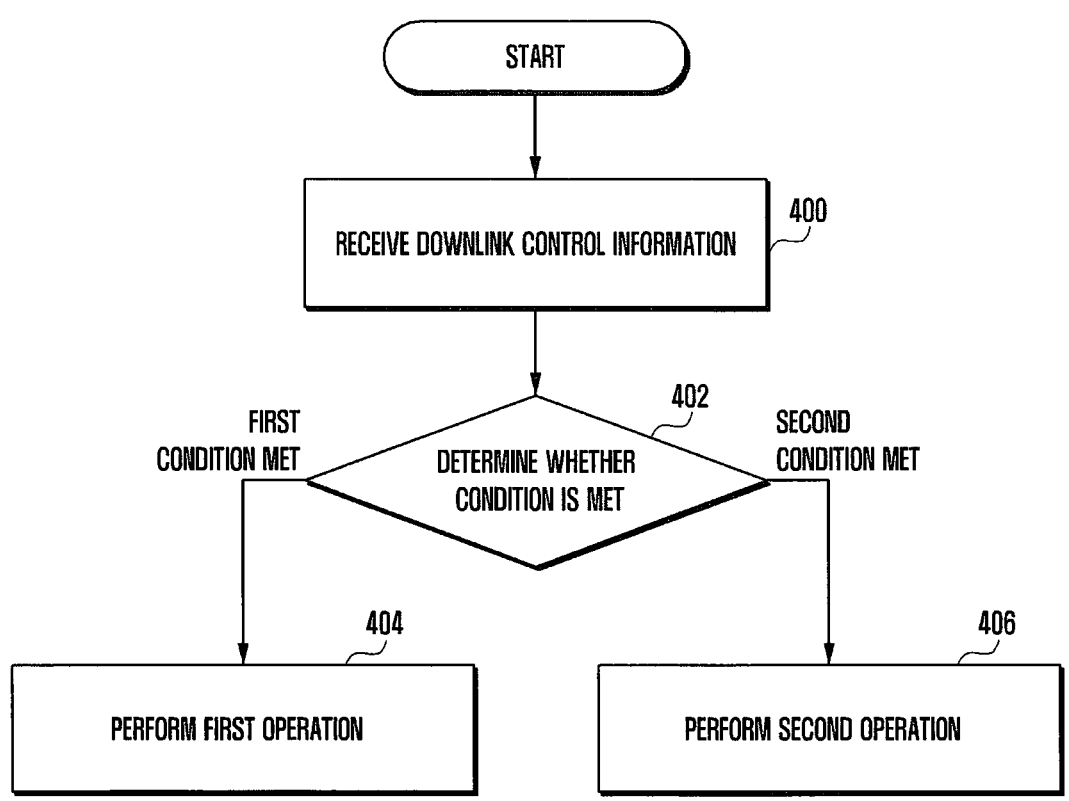
FIG. 4 is a block diagram illustrating a reception process of a terminal.

FIG. 4 is a block diagram illustrating a reception process of the terminal according to an embodiment of the disclosure.

In FIG. 4, the terminal receives downlink control information through a UE (cell)-common downlink control channel, a UE-group-common downlink control channel, or a UE-specific downlink control channel in step 400.

The terminal determines whether the received downlink control information corresponds to one or a combination of two or more of the following conditions in step 410.

A. RATI scrambled in CRC of downlink control information

B. Size of transport block included in downlink control information

C. base graph indicator included in downlink control information

D. Scheduling-related value included in downlink control information

If the RNTI scrambled in the CRC of the downlink control information, which is condition A, is an RNTI (for example, a semi-persistent scheduling (SPS)-RNTI) or a cell-RNTI (C-RNTI)) other than a random access (RA)-RNTI, a paging-RNTI (P-RNTI), a system information (SI)-RNTI, a single-cell (SC)-RNTI, or a group-RNTI (G-RNTI), the terminal determines condition 1 and performs operation 1 in step 420.

If the RNTI scrambled in the CRC of the downlink control information, which is condition A, is an RA-RNTI, a P-RNTI, an SI-RNTI, an SC-RNTI, or a G-RNTI, the terminal determines condition 2 and performs operation 2 in step 430.

If the size of the transport block included in the downlink control information, which is condition B, and the CRC is larger than or equal to a predetermined threshold value ($\Delta_1$), the terminal determines condition 1 and performs operation 1 in step 420.

If the size of the transport block included in the downlink control information, which is condition B, and the CRC is equal to or smaller than a predetermined threshold value ($\Delta_2$), the terminal determines condition 2 and performs operation 2 in step 430.

The threshold value ($\Delta_1$) or the threshold value ($\Delta_2$) may be a value fixed to 2560 (or 3840, 960, 1040, 1120, 170, 640, or a predetermined value). Further, the threshold value ($\Delta_1$) or the threshold value ($\Delta_2$) may be the same as or different from each other.

Alternatively, the threshold value ($\Delta_1$) or the threshold value ($\Delta_2$) may be a value configured in advance through higher-layer signaling such as SIB, RRC, or MAC CE or a value configured through downlink control information of a UE-group-common, UE-common, or UE-specific downlink control channel. At this time, before the threshold value ($\Delta$) is configured, a value fixed to 2560 (or 3840, 960, 1040, 1120, 170, 640, or a predetermined value) may be used as a default threshold value ($\Delta$). A time point before the threshold value ($\Delta_1$) or the threshold value ($\Delta_2$) is configured means a time point before the terminal scrambles CRC of downlink control information with an RA-RNTI, a P-RNTI, an SI-RNTI, an SC-RNTI, or a G-RNTI.

Alternatively, if the size of the transport block included in the downlink control information, which is condition B, and the CRC is smaller than 2560 (or 3840) (and larger than 160 or 640) and if a minimum code block length ($K_{min}$) among code block lengths (K) supportable by the first base graph that satisfies K> (transport block size+ CRC size) and code block lengths (K) supportable by the second base graph belongs to the first base graph, the terminal determines condition 1 and performs operation 1 in step 420.

Alternatively, if the size of the transport block included in the downlink control information, which is condition B, and the CRC is smaller than 2560 (or 3840) (and larger than 160 or 640) and if a minimum code block length K among code block lengths supportable by the first base graph that satisfies K> (transport block size+ CRC size) and code block lengths (K) supportable by the second base graph belongs to the second base graph, the terminal condition 2 and performs operation 2 in step 430.

This may be expressed using the following equation.

$$(TB+CRC) \leq K \leq V_2 \text{ where } K \in K^1 \text{ or } K \in K^2$$

$$K^* = \min(K)$$

If $K^* \in K^1$, condition 1 is satisfied, so operation 1 is performed in step 420

If $K^* \in K^2$, condition 2 is satisfied, so operation 2 is performed in step 430

K is a code block length, K* is a selected code block length, and TB is a transport block size. Further, the CRC is a CRC size, K' is a set of code block lengths supportable by the first base graph, and $K^2$ is a set of code block lengths supportable by the second base graph.

Alternatively, they may be expressed using the following equation.

$$V_1 \leq (TB+CRC) \leq K \leq V_2 \text{ where } K \in K^1 \text{ or } K \in K^2$$

$$K^* = \min(K)$$

If $K^* \in K^1$, condition 1 is satisfied, so operation 1 is performed in step 420

If $K^* \in K^2$, condition 2 is satisfied, so operation 2 is performed in step 430

K is a code block length, K* is a selected code block length, and TB is a transport block size. Further, the CRC is a CRC size, $K^1$ is a set of code block lengths supportable by the first base graph, and $K^2$ is a set of code block lengths supportable by the second base graph.

$K^1$ is a set of code block lengths supportable by the first base graph (or the maximum exponent matrix $E(H_S)_i^1$), and the types of sets may be one or a combination of two or more of the following values. $V_1$ may be 160, 640, or another value. $V_2$ may be 2560, 3840, 960, 1040, 1120, or another value.

Alternatively, if TB+CRC is smaller than $V_1$ in the above equation, decoding or encoding can be performed by applying one of the maximum exponent matrices $E(H_S)_i^2$. If TB+CRC is larger than $V_2$ in the above equation, decoding or encoding can be performed by applying one of the maximum exponent matrices $E(H_S)_i^1$.

$K^1$ is a set of code block lengths supportable by the first base graph (or the maximum exponent matrix $E(H_S)_i^1$), and the types of sets may be one or a combination of two or more of the following values.

1. The case in which K is equal to or smaller than 2560
   44, 66, 88, 132, 154, 176, 198, 242, 264, 286, 308, 330, 352, 296, 484, 528, 572, 616, 660, 704, 792, 968, 1056, 1144, 1232, 1320, 1408, 1584, 1936, 2112, 2288, 2464

2. The case in which K is equal to or smaller than 3840
   44, 66, 88, 132, 154, 176, 198, 242, 264, 286, 308, 330, 352, 296, 484, 528, 572, 616, 660, 704, 792, 968, 1056, 1144, 1232, 1320, 1408, 1584, 1936, 2112, 2288, 2464, 2640, 2816, 3168, 3520

3. The case in which K is equal to or smaller than 960
   44, 66, 88, 132, 154, 176, 198, 242, 264, 286, 308, 330, 352, 296, 484, 528, 572, 616, 660, 704, 792

4. The case in which K is equal to or smaller than 1040
   44, 66, 88, 132, 154, 176, 198, 242, 264, 286, 308, 330, 352, 296, 484, 528, 572, 616, 660, 704, 792, 968

5. The case in which K is equal to or smaller than 1120
   44, 66, 88, 132, 154, 176, 198, 242, 264, 286, 308, 330, 352, 296, 484, 528, 572, 616, 660, 704, 792, 968, 1056

If the values in the table are equal to or smaller than M, all or some of the values can be generally used while being omitted from the table. 160, 640, or another value may be selected as M.

$K^2$ is a set of code block lengths supportable by the second base graph (or the maximum exponent matrix $E(H_S)_i^2$), and the types of sets may be one or a combination of two or more of the following values.

1. The case in which K is equal to or smaller than 2560
   20, 30, 40, 50, 60, 70, 80, 90, 100, 110, 120, 130, 140, 150, 160, 180, 200, 220, 240, 260, 280, 300, 320, 360, 400, 440, 480, 520, 560, 600, 640, 720, 800, 880, 960, 1040, 1120, 1200, 1280, 1440, 1600, 1760, 1920, 2080, 2240, 2400, 2560

2. The case in which K is equal to or smaller than 3840
   20, 30, 40, 50, 60, 70, 80, 90, 100, 110, 120, 130, 140, 150, 160, 180, 200, 220, 240, 260, 280, 300, 320, 360, 400, 440, 480, 520, 560, 600, 640, 720, 800, 880, 960, 1040, 1120, 1200, 1280, 1440, 1600, 1760, 1920, 2080, 2240, 2400, 2560, (2720, 2880, 3040, 3200, 3360, 3520, 3680, 3840)

3. The case in which K is equal to or smaller than 960
   20, 30, 40, 50, 60, 70, 80, 90, 100, 110, 120, 130, 140, 150, 160, 180, 200, 220, 240, 260, 280, 300, 320, 360, 400, 440, 480, 520, 560, 600, 640, 720, 800, 880, 960

4. The case in which K is equal to or smaller than 1040
   20, 30, 40, 50, 60, 70, 80, 90, 100, 110, 120, 130, 140, 150, 160, 180, 200, 220, 240, 260, 280, 300, 320, 360, 400, 440, 480, 520, 560, 600, 640, 720, 800, 880, 960, 1040

5. The case in which K is equal to or smaller than 1120
   20, 30, 40, 50, 60, 70, 80, 90, 100, 110, 120, 130, 140, 150, 160, 180, 200, 220, 240, 260, 280, 300, 320, 360, 400, 440, 480, 520, 560, 600, 640, 720, 800, 880, 960, 1040, 1120

If the base graph indicator included in the downlink control information, which is condition C, indicates a value of 0 (or 1), the terminal determines condition 1 and performs operation 1 in step 420.

If the base graph indicator included in the downlink control information, which is condition C, indicates a value of 1 (or 0), the terminal determines condition 2 and performs operation 2 in step 430.

If MCS, RV, NDI, or frequency or time resource allocation values among the scheduling-related values included in the downlink control information, which are condition D, indicate specific information, the terminal determines condition 1 and performs operation 1 in step 420.

If MCS, RV, NDI, or frequency or time resource allocation values among the scheduling-related values included in the downlink control information, which are condition D, indicate specific information, the terminal determines condition 2 and performs operation 2 in step 430.

If the terminal performs operation 1, the terminal performs one or a combination of two or more operations.

1. The terminal attempts decoding on a transport block indicated by the downlink control information on the basis of code block lengths supportable by the first base graph (or the maximum exponent matrix $E(H_S)_i^1$).

2. The terminal attempts decoding on a transport block indicated by the downlink control information on the basis of the following table of supportable code blocks.

44, 66, 88, 110, 132, 154, 176, 198, 220, 242, 264, 286, 308, 330, 352, 296, 440, 484, 528, 572, 616, 660, 704, 792, 880, 968, 1056, 1144, 1232, 1320, 1408, 1584, 1760, 1936, 2112, 2288, 2464, 2640, 2816, 3168, 3520, 3872, 4224, 4576, 4928, 5280, 5632, 6336, 7040, 7744, 8448, (5984, 6688, 7392, 8096)

3. Among the following available code block sets, one or more combinations thereof correspond to code blocks that the terminal encodes or decodes using $E(H_S)_1^1$. For the corresponding code blocks, the terminal at least attempts decoding on a transport block indicated by the downlink control information on the basis of the matrix $E(H_S)_1^1$ supported by the first base graph.

A. 44, 88, 176, 352, 704, 1408, 2816, 5632
  B. 44, 66, 110, 154, 198, 242, 286, 330
  C. 44, 66, 154, 198, 242, 286, 330

4. Among the following available code block sets, one or more combinations) thereof correspond to code blocks that the terminal encodes or decodes using $E(H_S)_2^1$. For the corresponding code blocks, the terminal at least attempts decoding on a transport block indicated by the downlink control information on the basis of the matrix $E(H_S)_2^1$ supported by the first base graph.

A. 66, 132, 264, 528, 1056, 2112, 4224, 8448
  B. 88, 132, 220, 308, 396, 484, 572, 660
  C. 88, 132, 308, 396, 484, 572, 660

5. Among the following available code block sets, one or more combinations thereof correspond to code blocks that the terminal encodes or decodes using $E(H_S)_3^1$. For the corresponding code blocks, the terminal at least attempts decoding on a transport block indicated by the downlink control information on the basis of the matrix $E(H_S)_3^1$ supported by the first base graph.

A. 110, 220, 440, 880, 1760, 3520, 7040
  B. 176, 264, 440, 616, 792, 968, 1144, 1320
  C. 1760, 3520, 7040
  D. 3520, 7040
  E. 7040
  F. 176, 264, 616, 792, 968, 1144, 1320

6. Among the following available code block sets, one or more combinations thereof correspond to code blocks that the terminal encodes or decodes using $E(H_S)_4^1$. For the corresponding code blocks, the terminal at least attempts decoding on a transport block indicated by the downlink control information on the basis of the matrix $E(H_S)_4^1$ supported by the first base graph.

A. 154, 308, 616, 1232, 2464, 4928
  B. 352, 528, 880, 1232, 1584, 1936, 2288, 2640
  C. 352, 528, 1232, 1584, 1936, 2288, 2640

7. Among the following available code block sets, one or more combinations) thereof correspond to code blocks that the terminal encodes or decodes using $E(H_S)_5^1$. For the corresponding code blocks, the terminal at least attempts decoding on a transport block indicated by the downlink control information on the basis of the matrix $E(H_S)_5^1$ supported by the first base graph.

A. 198, 396, 792, 1584, 3168, 6336
  B. 704, 1056, 1760, 2464, 3168, 3872, 4576, 5280
  C. 704, 1056, 2464, 3168, 3872, 4576, 5280

8. Among the following available code block sets, one or more combinations) thereof correspond to code blocks that the terminal encodes or decodes using $E(H_S)_6^1$ For the corresponding code blocks, the terminal at least attempts decoding on a transport block indicated by the downlink control information on the basis of the matrix $E(H_S)_6^1$ supported by the first base graph.

A. 242, 484, 968, 1936, 3872
  B. 1408, 2112, 3520, 4928, 6336, 7744
  C. 1408, 2112, 4928, 6336, 7744

9. Among the following available code block sets, one or more combinations thereof correspond to code blocks that the terminal encodes or decodes using $E(H_S)_7^1$. For the corresponding code blocks, the terminal at least attempts decoding on a transport block indicated by the downlink control information on the basis of the matrix $E(H_S)_7^1$ supported by the first base graph.

A. 286, 572, 1144, 2288, 4576
  B. 2816, 4224, 7040

10. Among the following available code block sets, one or more combinations thereof correspond to code blocks that the terminal encodes or decodes using $E(H_S)_8^1$. For the corresponding code blocks, the terminal at least attempts decoding on a transport block indicated by the downlink control information on the basis of the matrix $E(H_S)_8^1$ supported by the first base graph.

A. 330, 660, 1320, 2640, 5280
  B. 5632, 8448

If the terminal performs operation 2, the terminal performs one or a combination of two or more of the following operations.

1. The terminal attempts decoding on a transport block indicated by the downlink control information on the basis of code block lengths supportable by the second base graph.

2. The terminal attempts decoding on a transport block indicated by the downlink control information on the basis of the following table of supportable code blocks.

20, 30, 40, 50, 60, 70, 80, 90, 100, 110, 120, 130, 140, 150, 160, 180, 200, 220, 240, 260, 280, 300, 320, 360, 400, 440, 480, 520, 560, 600, 640, 720, 800, 880, 960, 1040, 1120, 1200, 1280, 1440, 1600, 1760, 1920, 2080, 2240, 2400, 2560 (2880, 3200, 3520, 3840, 2720, 3040, 3360, 3680)

3. Among the following available code block sets, one or more combinations thereof correspond to code blocks that the terminal encodes or decodes using $E(H_S)_1^2$. For the corresponding code blocks, the terminal at least attempts decoding on a transport block indicated by the downlink control information on the basis of the matrix $E(H_S)_1^2$ supported by the second base graph.

A. 20, 40, 80, 160, 320, 640, 1280
  B. 20, 30, 50, 70, 90, 110, 130, 150

4. Among the following available code block sets, one or more combinations thereof correspond to code blocks that the terminal encodes or decodes using $E(H_S)_2^2$. For the corresponding code blocks, the terminal at least attempts decoding on a transport block indicated by the downlink control information on the basis of the matrix $E(H_S)_2{}^2$ supported by the second base graph.
- A. 30, 60, 120, 240, 480, 960, 1920, (3840)
- B. 40, 60, 100, 140, 180, 220, 260, 300

5. Among the following available code block sets, one or more combinations thereof correspond to code blocks that the terminal encodes or decodes using $E(H_S)_3{}^2$. For the corresponding code blocks, the terminal at least attempts decoding on a transport block indicated by the downlink control information on the basis of the matrix $E(H_S)_2{}^3$ supported by the second base graph.
- A. 50, 100, 200, 400, 800, 1600, (3200)
- B. 80, 120, 200, 280, 360, 440, 520, 600

6. Among the following available code block sets, one or more combinations thereof correspond to code blocks that the terminal encodes or decodes using $E(H_S)_4{}^2$. For the corresponding code blocks, the terminal at least attempts decoding on a transport block indicated by the downlink control information on the basis of the matrix $E(H_S)_4{}^2$ supported by the second base graph.
- A. 70, 140, 280, 560, 1120, 2240
- B. 160, 240, 400, 560, 720, 880, 1040, 1200

7. Among the following available code block sets, one or more combinations thereof correspond to code blocks that the terminal encodes or decodes using $E(H_S)_5{}^2$. For the corresponding code blocks, the terminal at least attempts decoding on a transport block indicated by the downlink control information on the basis of the matrix $E(H_S)_5{}^2$ supported by the second base graph.
- A. 90, 180, 360, 720, 1440, (2880)
- B. 320, 480, 800, 1120, 1440, 1760, 2080, 2400

8. Among the following available code block sets, one or more combinations thereof correspond to code blocks that the terminal encodes or decodes using $E(H_S)_6{}^2$. For the corresponding code blocks, the terminal at least attempts decoding on a transport block indicated by the downlink control information on the basis of the matrix $E(H_S)_6{}^2$ supported by the second base graph.
- A. 110, 220, 440, 880, 1760, (3520)
- B. 640, 960, 1600, 2240, (2880), (3520)

9. Among the following available code block sets, one or more combinations) thereof correspond to code blocks that the terminal encodes or decodes using $E(H_S)_7{}^2$. For the corresponding code blocks, the terminal at least attempts decoding on a transport block indicated by the downlink control information on the basis of the matrix $E(H_S)_7{}^2$ supported by the second base graph.
- A. 130, 260, 520, 1040, 2080
- B. 1280, 1920, (3200)

10. Among the following available code block sets, one or more combinations thereof correspond to code blocks that the terminal encodes or decodes using $E(H^S)_8{}^2$. For the corresponding code blocks, the terminal at least attempts decoding on a transport block indicated by the downlink control information on the basis of the matrix $E(H_S)_8{}^2$ supported by the second base graph.
- A. 150, 300, 600, 1200, 2400
- B. 2560, (3840)

In the disclosure, a number in brackets means that the corresponding value may or may not be included.

In the disclosure, an information bit may refer to the amount of data to be transmitted from a higher layer or a transport block size (TBS). The TBS is generally transmitted during one TTI, but can be transmitted over a plurality of TTIs. In the disclosure, the TBS is indicated by N.

In the disclosure, values in brackets shown in a table are values that may be entirely or partially included in the table or all or some of the values may not be partially included therein.

Figure 5:
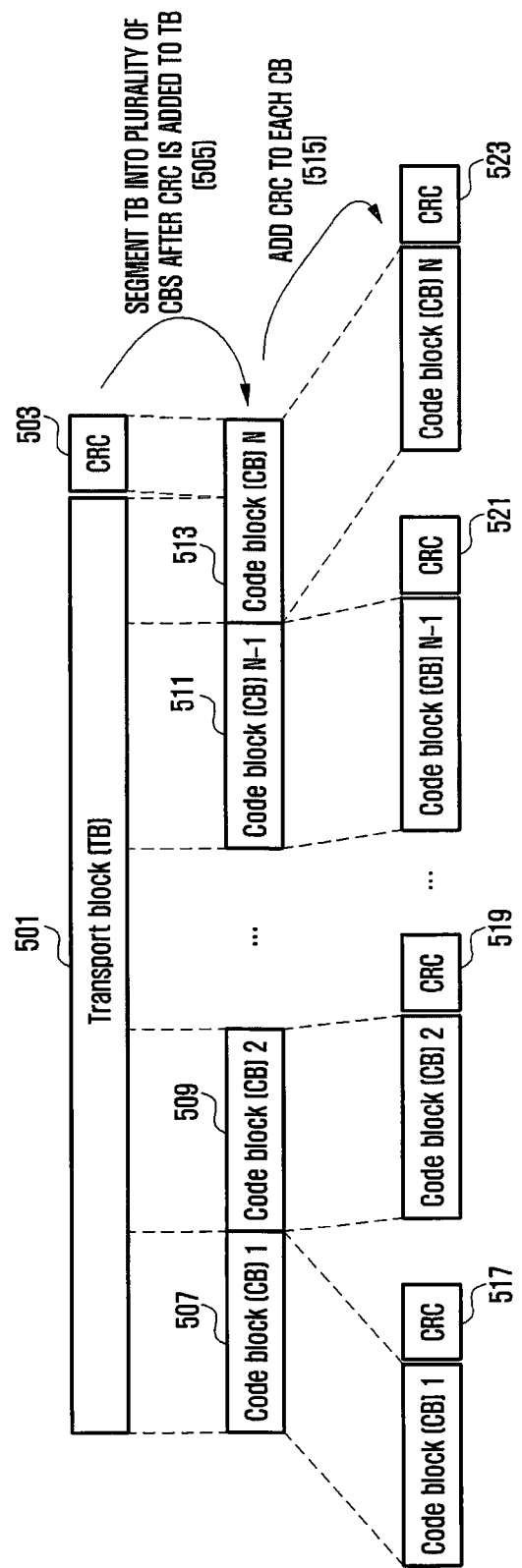
FIG. 5 illustrates a method of segmenting a transport block (TB) into code blocks.

FIG. 5 illustrates a method of segmenting one transport block into one or more code blocks (CBs). Referring to FIG. 5, a CRC 503 may be added to the last part or the first part of one transport block 501 to be transmitted in the uplink or the downlink. The CRC may have 16 bits, 24 bits, a predetermined number of bits, or a variable number of bits according to a channel condition, and may be used to determine whether channel coding is successful. Blocks 501 and 503, to which the TB and the CRC are added, may be segmented into a plurality of code blocks 507, 509, 511, and 513, as indicated by reference numeral 505.

The code blocks may be segmented after the maximum sizes thereof are predetermined, in which case the last code block 513 may be smaller than other code blocks or may be made to have the same length as other code blocks by inserting 0, a random value, or 1. CRCs 517, 519, 521, and 523 may be added to the segmented code blocks, respectively, as indicated by reference numeral 515. The CRC may have 16 bits, 24 bits, or a predetermined number of bits, and may be used to determine whether channel coding is successful. However, the CRC 503 added to the TB and the CRCs 517, 519, 521, and 523 added to the segmented code blocks may have variable lengths depending on the type of channel code to be applied to the code block. Further, the CRC may be added or omitted when a polar code is used. In the segmentation process, if the number of CBs is one, the CRC 517 added to the CB may be omitted.

The length of the CRC inserted into a TB used for determining whether TB decoding is successful after the receiver performs TB decoding is L, and L may have at least two available values. That is, if the transport block is segmented into two or more code blocks and transmitted, a long CRC may be used. On the other hand, if the transport block is segmented into one code block and transmitted, a short CRC may be used. If the LDPC code is used for encoding in the mobile communication system, the LDPC code itself has a parity check function, and thus may have a function of determining whether decoding is successful without CRC insertion.

If the LDPC code is used and it is desired to acquire an additional decoding success determination level in a specific mobile communication system, a technology for determining whether decoding is finally successful in addition to insertion of the parity check function of the LDPC code may be used, and thus an error rate level of the determination about whether decoding is successful, desired by the system, can be obtained. For example, if an error rate of a determination about whether decoding is successful, required by the system, is 10-6 and an error rate of determination acquired by the parity check function of the LDPC code is 10-3, the final system determination error rate of 10-6 may be achieved by additionally inserting the CRC having the determination error rate of 10-3.

In general, as the length of the CRC is longer, the error rate of the determination as to whether decoding is successful becomes lower. If the transport block is segmented into two or more code blocks and transmitted, the TB itself is configured through concatenation of LDPC codes and thus cannot use a parity check function of the LDPC code. On the other hand, if the transport block includes one code block, the parity check function of the LDPC code may be used. Accordingly, in a specific system, the TB can be used after a long CRC or a short CRC is inserted into the TB according to the number of code blocks within the transport block. In embodiments of the disclosure, it is assumed that a long length L+ or a short length L− may be used as the length L of the CRC inserted into the TB according to whether the TB is segmented into two or more code blocks. A value available for L+ may be 24, which is used in the LTE system, and any length shorter than 24 may be used for L− and 16, which is used by the control channel of the LTE system, may be reused. However, in embodiments of the disclosure, L− is not limited to 16.

Whether a specific TB is segmented into a plurality of code blocks is determined according to whether the given TB can be transmitted using one code block, so the determination may be performed as follows:

If N+L− is equal to or smaller than the largest available CB length, the TB is transmitted using one code block (If (N+L−)<=$K_{max}$, then one CB is used)

If N+L− is larger than the largest available CB length, the TB is segmented into a plurality of code blocks and transmitted (If (N+L−)>$K_{max}$, then CB is segmented)

$K_{max}$ indicates the largest code block size among available code block sizes.

In the conventional LTE system, an MCS index transmitted through DCI and the number of allocated PRBs are used to determine the TBS. On the basis of the downlink, an MCS index of 5 bits may be transmitted, and thus a modulation order $Q_m$ and a TBS index may be derived from [Table 6] below.

TABLE 6

| MCS Index $I_{MCS}$ | Modulation Order $Q_m$ | TBS Index $I_{TBS}$ |
|---|---|---|
| 0 | 2 | 0 |
| 1 | 2 | 1 |
| 2 | 2 | 2 |
| 3 | 2 | 3 |
| 4 | 2 | 4 |
| 5 | 2 | 5 |
| 6 | 2 | 6 |
| 7 | 2 | 7 |
| 8 | 2 | 8 |
| 9 | 2 | 9 |
| 10 | 4 | 9 |
| 11 | 4 | 10 |
| 12 | 4 | 11 |
| 13 | 4 | 12 |
| 14 | 4 | 13 |
| 15 | 4 | 14 |
| 16 | 4 | 15 |
| 17 | 6 | 15 |
| 18 | 6 | 16 |
| 19 | 6 | 17 |
| 20 | 6 | 18 |
| 21 | 6 | 19 |
| 22 | 6 | 20 |
| 23 | 6 | 21 |
| 24 | 6 | 22 |
| 25 | 6 | 23 |
| 26 | 6 | 24 |
| 27 | 6 | 25 |
| 28 | 6 | 26 |
| 29 | 2 | reserved |
| 30 | 4 | |
| 31 | 6 | |

The number of PRBs used for data transmission may be derived from resource allocation information transmitted through DCI, and the TBS may be determined on the basis of [Table 7] below along with the TBS index derived from [Table 6] above.

TABLE 7

| $I_{TBS}$ | $N_{PRB}$ | | | | | | | | | |
|---|---|---|---|---|---|---|---|---|---|---|
| | 1 | 2 | 3 | 4 | 5 | 6 | 7 | 8 | 9 | 10 |
| 0 | 16 | 32 | 56 | 88 | 120 | 152 | 176 | 208 | 224 | 256 |
| 1 | 24 | 56 | 88 | 144 | 176 | 208 | 224 | 256 | 328 | 344 |
| 2 | 32 | 72 | 144 | 176 | 208 | 256 | 296 | 328 | 376 | 424 |
| 3 | 40 | 104 | 176 | 208 | 256 | 328 | 392 | 440 | 504 | 568 |
| 4 | 56 | 120 | 208 | 256 | 328 | 408 | 488 | 552 | 632 | 696 |
| 5 | 72 | 144 | 224 | 328 | 424 | 504 | 600 | 680 | 776 | 872 |
| 6 | 328 | 176 | 256 | 392 | 504 | 600 | 712 | 808 | 936 | 1032 |
| 7 | 104 | 224 | 328 | 472 | 584 | 712 | 840 | 968 | 1096 | 1224 |
| 8 | 120 | 256 | 392 | 536 | 680 | 808 | 968 | 1096 | 1256 | 1384 |
| 9 | 136 | 296 | 456 | 616 | 776 | 936 | 1096 | 1256 | 1416 | 1544 |
| 10 | 144 | 328 | 504 | 680 | 872 | 1032 | 1224 | 1384 | 1544 | 1736 |
| 11 | 176 | 376 | 584 | 776 | 1000 | 1192 | 1384 | 1608 | 1800 | 2024 |
| 12 | 208 | 440 | 680 | 904 | 1128 | 1352 | 1608 | 1800 | 2024 | 2280 |
| 13 | 224 | 488 | 744 | 1000 | 1256 | 1544 | 1800 | 2024 | 2280 | 2536 |
| 14 | 256 | 552 | 840 | 1128 | 1416 | 1736 | 1992 | 2280 | 2600 | 2856 |
| 15 | 280 | 600 | 904 | 1224 | 1544 | 1800 | 2152 | 2472 | 2728 | 3112 |
| 16 | 328 | 632 | 968 | 1288 | 1608 | 1928 | 2280 | 2600 | 2984 | 3240 |
| 17 | 336 | 696 | 1064 | 1416 | 1800 | 2152 | 2536 | 2856 | 3240 | 3624 |
| 18 | 376 | 776 | 1160 | 1544 | 1992 | 2344 | 2792 | 3112 | 3624 | 4008 |
| 19 | 408 | 840 | 1288 | 1736 | 2152 | 2600 | 2984 | 3496 | 3880 | 4264 |
| 20 | 440 | 904 | 1384 | 1864 | 2344 | 2792 | 3240 | 3752 | 4136 | 4584 |
| 21 | 488 | 1000 | 1480 | 1992 | 2472 | 2984 | 3496 | 4008 | 4584 | 4968 |
| 22 | 520 | 1064 | 1608 | 2152 | 2664 | 3240 | 3752 | 4264 | 4776 | 5352 |
| 23 | 552 | 1128 | 1736 | 2280 | 2856 | 3496 | 4008 | 4584 | 5160 | 5736 |
| 24 | 584 | 1192 | 1800 | 2408 | 2984 | 3624 | 4264 | 4968 | 5544 | 5992 |
| 25 | 616 | 1256 | 1864 | 2536 | 3112 | 3752 | 4392 | 5160 | 5736 | 6200 |
| 26 | 712 | 1480 | 2216 | 2984 | 3752 | 4392 | 5160 | 5992 | 6712 | 7480 |

[Table 7] above is a TBS table in the case in which the PRB is 1 to 10 and the TBS index is 0 to 26, or is used even in the case in which the PRB is up to 110 and an additional TBS index is used. A number in a space corresponding to the number of allocated PRBs and the TBS index in the above table is a TBS understood by the base station and the terminal.

A method and an apparatus for determining a TBS for downlink data transmission by the terminal described in the disclosure may be sufficiently applied to a process of encoding a transport block of an uplink data channel. Further, the encoding and decoding operation of the terminal described in the disclosure may be sufficiently applied to the encoding and decoding operation of the base station.

In the disclosure, a transport block may be data transmitted from a higher layer to a physical layer and may be a unit that can be initially transmitted by a physical layer.

In the disclosure, N1_max and N2_max may indicate a maximum code block length when BG #1 is used in the LDPC code and a maximum code block length when BG #2 is used. For example, N1_max=8448 and N2_max=3840. However, the embodiments of the disclosure are not limited thereto. In the disclosure, N1_max may be interchangeably used with $N1_{max}$ or $N_{1,max}$, and N2_max may be interchangeably used with $N2_{max}$ or $N_{2,max}$.

In the disclosure, L_{TB,16} and L_{TB,24} may be lengths of CRCs added to the TB, and L_{TB,16}<L_{TB,24}. For example, L_{TB,16} may be 16, and L_{TB,24} may be 24. In the disclosure, L_{TB,16} may be interchangeably used with $L_{TB,16}$, and L_{TB,24} may be interchangeably used with $L_{TB,24}$. In the disclosure, L_{CB} may be the length of the CRC added to the CB, and may be interchangeably used with $L_{CB}$.

Embodiment 1

Embodiment 1 provides a method of determining a TBS according to selection of a CB-CRC and a base graph (BG). The present embodiment may be applied to the case in which a TB is segmented into two or more code blocks when the TBS is large and each code block is channel-coded to an LDPC code using BG #2 in a specific case. That is, even when the TBS is large, the present embodiment may be applied to the case in which data can be transmitted using BG #2. In the present embodiment, R_1 and R_2 may indicate code rates, which are references for selecting BG #1 or BG #2, and may be interchangeably used with $R_1$ and $R_2$. For example, $R_1=\frac{1}{4}$ and $R_2=\frac{2}{3}$, but the method provided by the disclosure is not limited thereto. Further, in the disclosure, R, $R_1$, and $R_2$, indicated as the code rates, may be expressed and determined in various methods such as a fraction and a decimal. For example, R may be a value such as 0.28 but is not limited thereto, and various numbers and values may be used. When a BG is selected between BG #1 and BG #2 in data transmission, a code rate and a soft buffer of the terminal may be considered.

The base station may transmit data by allocating frequency resources of a predetermined number of PRBs and time resources of a predetermined number of slots or symbols to the terminal, and scheduling information related thereto may be transmitted to the terminal through downlink control information (DCI), configuration transmitted through higher-layer signaling, or a combination thereof. If scheduling information of the base station and the terminal is given, the TBS may be determined in the following order.

Step 1-1: determine the number (A) of temporary information bits

Step 1-2: process of determining the number (C) of temporary CBs, performing byte alignment (making A a multiple of 8), and making A a multiple (B) of the number of CBs Step 1-3: process of determining TBS except for the number of CRC bits (TBS)

In step 1-1, a temporary TBS value is determined in consideration of the amount of resource areas to which data to be transmitted may be mapped. The number of temporary information bits may be determined by a combination of one or more of a code rate (R), a modulation order ($Q_m$), the number ($N_{RE}$) of REs to which rate-matched data is mapped, the number of allocated PRBs or RBs (# PRB), the number of allocated OFDM symbols, the number of allocated slots, and a reference value of the number of mapped REs within one PRB. For example, A may be determined using [Equation 10] below.

$$A = N_{RE} \times Q_m \times R \times v \quad \text{[Equation 10]}$$

A modulation order $Q_m$ and a code rate R may be transmitted to the terminal while being included in DCI. The number v of layers used for transmission may be transmitted to the terminal through DCI, higher-layer signaling, or a combination thereof. $N_{RE}$ may be determined by the base station using the number of REs to which data is mapped through rate matching when data is transmitted, and may be equally understood by the base station and the terminal if both the base station and the terminal are aware of resource allocation information. When $N_{RE}$ is calculated, data is mapped in a rate-matching scheme, but an RE to which data is not actually mapped because the data is punctured for a specific reason, such as transmission of a channel state information reference signal (CSI-RS), URLLC, or uplink control information (UCI), is included in $N_{RE}$. This is to make both the base station and the terminal equally understand the TBS even when the base station does not transmit some data scheduled to be mapped in a puncturing scheme without informing the terminal of the same.

An MCS table such as [Table 8] below may be defined, and the base station may transfer an MCS index to the terminal to transmit information on $Q_m$ and R. The modulation order refers to information such as QPSK, 16 QAM, 64 QAM, 256 QAM, or 1024 QAM. $Q_m=2$ in the case of QPSK, $Q_m=4$ in the case of 16 QAM, $Q_m=6$ in the case of 64 QAM, $Q_m=8$ in the case of 256 QAM, and $Q_m=10$ in the case of 1024 QAM. That is, $Q_m$ may be the number of bits that can be transmitted in a modulated symbol.

TABLE 8

| MCS Index | Modulation Order | Code Rate |
|---|---|---|
| 0 | 2 | 0.1171875 |
| 1 | 2 | 0.15332031 |
| 2 | 2 | 0.18847656 |
| 3 | 2 | 0.24511719 |
| 4 | 2 | 0.30078125 |
| 5 | 2 | 0.37011719 |
| 6 | 2 | 0.43847656 |
| 7 | 2 | 0.51367188 |
| 8 | 2 | 0.58789063 |
| 9 | 2 | 0.66308594 |
| 10 | 4 | 0.33203125 |
| 11 | 4 | 0.36914063 |
| 12 | 4 | 0.42382813 |
| 13 | 4 | 0.47851563 |
| 14 | 4 | 0.54003906 |
| 15 | 4 | 0.6015625 |
| 16 | 4 | 0.64257813 |
| 17 | 6 | 0.42773438 |
| 18 | 6 | 0.45507813 |
| 19 | 6 | 0.50488281 |
| 20 | 6 | 0.55371094 |
| 21 | 6 | 0.6015625 |
| 22 | 6 | 0.65039063 |
| 23 | 6 | 0.70214844 |
| 24 | 6 | 0.75390625 |
| 25 | 6 | 0.80273438 |
| 26 | 6 | 0.85253906 |
| 27 | 6 | 0.88867188 |
| 28 | 6 | 0.92578125 |
| 29 | 2 | N/A |
| 30 | 4 | N/A |
| 31 | 6 | N/A |

In [Table 8] above, $Q_m$ and R are transmitted together by an MCS index of 5 bits, but may be transmitted to the terminal in various methods such that $Q_m$ and R are transmitted by an MCS index of 6 bits through DCI or such that each of $Q_m$ of 3 bits and R of 3 bits uses a bit field. Alternatively, A=(number of allocated PRBs)×(number of reference REs per PRB)×$Q_m$×R×v.

Step 1-2 is a step of determining the number C of temporary code blocks (number of temporary CBs) using determined A and making A a multiple of 8 and a multiple of the number of temporary CBs on the basis thereof. This is to make the finally determined TBS and the length of the CRC added to the TB byte-aligned, and also a multiple of the CB. First, the number of temporary CBs may be determined by [pseudo-code 1] below.

[pseudo-code 1]
[Start]

if $R \leq R_1$, then $C = \left\lceil \dfrac{A}{N_{2,max}} \right\rceil$,

Else $C = \left\lceil \dfrac{A}{N_{1,max}} \right\rceil$.

```
        End if of R
        [End]
```

R is a code rate, and may be a value transmitted through DCI as described above. As described above, $R_1$ may be ¼, $N_{1,max}$ may be 8448, and $N_{2,max}$ may be 3840. In this case, the determination may be made using [pseudo-code 2], but is not limited thereto. At this time, $R_1$, $N_{1,max}$, and $N_{2,max}$ are described as ¼, 8448, and 3840 by way of example, but are not limited thereto, and other values may be used.

```
        [pseudo-code 2]
        [Start]
        if R ≤ 1/4, then C = ⌈A/3840⌉, Else C = ⌈A/8448⌉.
        End if of R
        [End]
```

C, obtained above, may be the number of temporary CBs. CB segmentation is performed when the TB is finally transmitted and the number of temporary CBs may be different from the number of actual CBs that are obtained. It may be determined that the numbers of actual CBs and temporary CBs may be the same as each other.

Then, a process of generating B by making A, determined in step 1-1, multiples of 8 and C is performed, which is to prevent unnecessary bits or unnecessary zero-padding bits from being included in all code blocks. B may be calculated as shown in [Table 11] below.

$$B = \left\lceil \frac{A}{8C} \right\rceil \times 8C \quad \text{[Equation 11]}$$

[Equation 11] above may be transformed to $$B = \left\lfloor \frac{A}{8C} \right\rfloor \times 8C,$$

B=A+(8C−mod(A,8C)), and B=A−mod (A,8C) and then applied. In the disclosure, mod(x,y) may be a remainder obtained by dividing x by y, and may be transformed to x−⌊x/y⌋×y and then applied. In the disclosure, ⌈x⌉ is a minimum integer larger than x, and may be interchangeably used with ceil(x). ⌊x⌋ is a maximum integer smaller than x, and may be interchangeably used with floor(x). [Equation 11] may be transformed to $$B = \text{Round}\left(\frac{A}{8C}\right) \times 8C,$$

which means that B is the multiple of 8C that is the closest to A. Round(x) may be the integer that is the closest to x, or x when rounded off.

[Equation 11] is to make A a multiple of 8C, but may be transformed to an equation for making A a common multiple or the lowest common multiple of 8 and C and then applied. Accordingly, [Equation 11] above may be transformed to $$B = \left\lceil \frac{A}{LCM(8, C)} \right\rceil \times LCM(8, C),$$

$$B = \left\lfloor \frac{A}{LCM(8, C)} \right\rfloor \times LCM(8, C), \text{ or}$$

$$B = \text{Round}\left(\frac{A}{LCM(8, C)}\right) \times LCM(8, C)$$

and then applied. LCM(a,b) is the lowest common multiple of a and b.

Information bits transmitted in allocated resources are obtained in steps up to step 1-2, and a process of excluding the number of bits added for the CRC from the obtained information bits to be transmitted is performed in the final step 1-3. This may be performed by [pseudo-code 3] below.

```
        [pseudo-code 3]
        [Start]
        If R ≤ R_1,
            If B ≤ N_{2,max}, then TBS = B - L_{TB,16}
            Else TBS = B - L_{TB,24} - C X L_{CB}
            End if of B
        Else
            If B ≤ N_{2,max}, then TBS = B - L_{TB,16}
            Else if B ≤ N_{1,max}, then TBS = B - L_{TB,24}
            Else TBS = B - L_{TB,24} - C X L_{CB}
            End if of B
        End if of R
        [End]
```

If each parameter value is determined and applied as above, pseudo-code 3] can be applied to [pseudo-code 4] below but is not limited thereto.

```
        [pseudo-code 4]
        [Start]
        If R ≤ 1/4,
            If B ≤ 3840, then TBS = B - 16
            Else TBS = B - 24 X(C+1)
            End if of B
        Else
            If B ≤ 3840, then TBS = B - 16
            Else if B ≤ 8448, then TBS = B - 24
            Else TBS = B - 24 X(C+1)
            End if of B
        End if of R
        [End]
```

$L_{TB,16}$ and $L_{TB,24}$ are considered since the CRC length applied to the TB varies depending on the TBS. If the number of code blocks is 1, the CRC added to the CB may be omitted, or the CRC length added to the CB may be 0.

In another example, step 1-3 may be transformed to [pseudo-code 5] or [pseudo-code 6] below and then applied.

```
        [pseudo-code 5]
        [Start]
        If B ≤ N_{2,max}, then TBS = B - L_{TB,16}
        Else TBS = B - L_{TB,24}
        End if of B
        [End]
```

```
[pseudo-code 6]
[Start]
If B ≤ 3840, then TBS = B - 16
Else TBS = B - 24
End if of B
[End]
```

In [pseudo-code 5] or [pseudo-code 6], the CRC length added to the CB is not excluded in order to obtain the final TBS. Accordingly, when actual data is subsequently mapped and transmitted, the CRC length of the CB may be added to the obtained TBS, so that an actual code rate may be larger than R.

Figure 6:
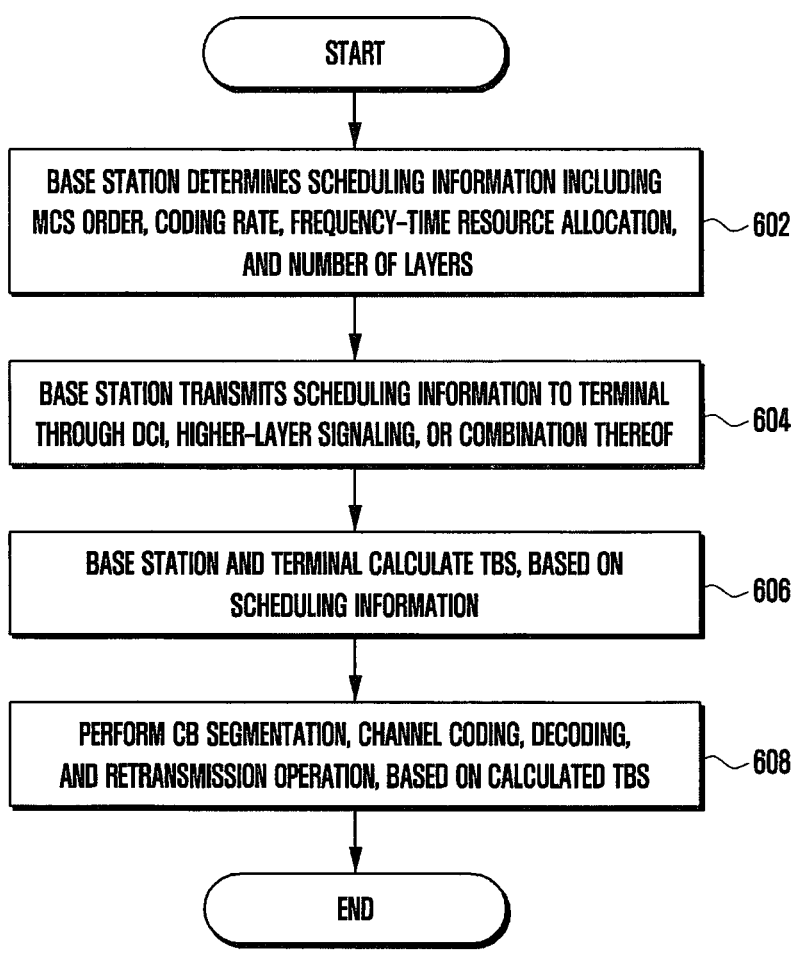
FIG. 6 is a flowchart illustrating operation of the base station and the terminal implementing some embodiments of the disclosure.

FIG. 6 is a flowchart illustrating a step in which the base station and the terminal obtain the TBS and transmit and receive data when scheduling and transmitting downlink or uplink data. When the scheduling and data transmission process starts, the base station determines scheduling information in step 602 and transfers the scheduling information through a combination of one or more of DCI, system information, MAC CE, and RRC signaling to the terminal in step 604. The terminal and the base station obtain a TBS from the determined scheduling information in step 606. In step 606, the TBS may be obtained using step 1-1, step 1-2, and step 1-3 described above. Step 1-1, step 1-2, and step 1-3 may be combined and performed at the same time, or the order thereof may be changed. Thereafter, CB segmentation and channel coding, decoding, and retransmission operations are performed using the TBS in step 608, which completes data scheduling and transmission.

The TBS determination method provided by the embodiment can be applied only to the case in which a specific combination of an MCS index and the number of allocated PRBs prearranged between the base station and the terminal is not applied. For example, if scheduling is determined with MCS index 6 and the number of PRBs is 1, the TBS may be determined as a fixed value of 328 and data may be transmitted, rather than using the above method. Accordingly, the base station and the terminal may predetermine and know TBS values according to a combination of {MCS index or code rate index, number of PRBs}, and the TBS may be determined through the method provided by the embodiment only in cases other than the combination.

The TBS determination method according to the present embodiment corresponds only to initial transmission, and, in retransmission, transmission and reception may be performed on the basis of the assumption of the TBS determined in initial transmission corresponding to the retransmission.

Embodiment 2

[Embodiment 2] provides a TBS determination method according to selection of CB-CRC and BG. The present embodiment may be applied to the case in which a TB is segmented into two or more code blocks when the TBS is large and each code block is channel-coded to an LDPC code using BG #2 in a specific case. That is, even when the TBS is large, the present embodiment may be applied to the case in which data can be transmitted using BG #2. In the present embodiment, R_1 and R_2 may indicate code rates which are the reference for selecting BG #1 or BG #2 of the LDPC, and $R_1$ and $R_2$ may be interchangeably used. For example, $R_1=\frac{1}{4}$ and $R_2=\frac{2}{3}$, but the method provided by the disclosure is not limited thereto. Further, in the disclosure, R, referring to the code rate, $R_1$, and $R_2$ may be expressed and determined in various ways, for example, as a fraction or a decimal. When a BG is selected between BG #1 and BG #2 in data transmission, a code rate and a soft buffer of the terminal may be considered. In the present embodiment, a process for making the TBS a multiple of 8, a multiple of the number of CBs, or a common multiple or the lowest common multiple of 8 and the number of CBs may be performed at the end of TBS calculation.

The base station may transmit data by allocating frequency resources of a predetermined number of PRBs and time resources of a predetermined number of slots or symbols to the terminal, and scheduling information related thereto may be transmitted to the terminal through downlink control information (DCI), configuration transmitted through higher-layer signaling, or a combination thereof. When scheduling information of the base station and the terminal is given, the TBS may be determined in the following order.

Step 2-1: determine the number (A) of temporary information bits

Step 2-2: determine the number (C) of temporary CBs using determined A, determine the TBS by controlling A by making a value obtained by adding the TB-CRC length to the TBS to be byte-aligned (be a multiple of 8) and to be a multiple of a number of temporary CBs Step 2-1 may be the same as the process of step 1-1 in [Embodiment 1]. In [Step 2-1], a temporary TBS value is determined in consideration of an amount of resource areas to which data to be transmitted can be mapped. The number of temporary information bits may be determined by a combination of one or more of a code rate (R), a modulation order ($Q_m$), the number ($N_{RE}$) of REs to which rate-matched data is mapped, the number of allocated PRBs or RBs (# PRB), the number of allocated OFDM symbols, the number of allocated slots, and a reference value of the number of mapped REs within one PRB.

For example, A may be determined by $A=N_{RE} \times Q_m \times R \times v$, corresponding to [Equation 10] above. A modulation order $Q_m$ and a code rate R may be transmitted to the terminal while being included in DCI. The number v of layers used for transmission may be transmitted to the terminal through DCI, higher-layer signaling, or a combination thereof. $N_{RE}$ may be determined by the base station using the number of REs to which data is mapped through rate matching when data is transmitted, and may be equally understood by the base station and the terminal if both the base station and the terminal are aware of resource allocation information. When $N_{RE}$ is calculated, data is mapped through rate matching, but an RE to which data is not mapped due to puncturing of the data for a specific reason, such as CSI-RS, URLLC, or UCI transmission, is included in $N_{RE}$. This is to make both the base station and the terminal equally understand the TBS even when the base station does not transmit some data scheduled to be mapped in a puncturing scheme without informing the terminal of the same.

An MCS table such as [Table 8] above may be defined, and the base station may transfer an MCS index to the terminal to transmit information on $Q_m$ and R. The modulation order refers to information such as QPSK, 16 QAM, 64 QAM, 256 QAM, or 1024 QAM. $Q_m=2$ in the case of QPSK, $Q_m=4$ in the case of 16 QAM, $Q_m=6$ in the case of 64 QAM, $Q_m=8$ in the case of 256 QAM, and $Q_m=10$ in the case of 1024 QAM. That is, $Q_m$ may be the number of bits that can be transmitted in a modulated symbol. In [Table 8] above, $Q_m$ and R are transmitted together by an MCS index of 5 bits, but may be transmitted to the terminal in various methods such that $Q_m$ and R are transmitted by an MCS index of 6 bits through DCI or such that each of $Q_m$ of 3 bits and R of 3 bits uses a bit field. Alternatively, A=(number of allocated PRBs)×(number of reference REs per PRB)×$Q_m$×R×v.

Step 2-2 may be performed as shown in [pseudo-code 7] or [pseudo-code 8] below.

---

[pseudo-code 7]
[Start]
If R ≤ $R_1$,
    If A ≤ $N_{2,max} - L_{TB,16}$, $$C = 1 \text{ and } TBS = \left\lceil \frac{A}{8} \right\rceil \times 8.$$

Else $$C = \left\lceil \frac{A + L_{TB,24}}{N_{2,max} - L_{TB,24}} \right\rceil$$

$$TBS = \left\lceil \frac{A + L_{TB,24}}{C \times 8} \right\rceil \times C \times 8 - L_{TB,24}$$

End if of A
Else
    If A ≤ $N_{1,max} - L_{TB,24}$, $$C = 1 \text{ and } TBS = \left\lceil \frac{A}{8} \right\rceil \times 8.$$

Else $$C = \left\lceil \frac{A + L_{TB,24}}{N_{1,max} - L_{TB,24}} \right\rceil$$

$$TBS = \left\lceil \frac{A + L_{TB,24}}{C \times 8} \right\rceil \times C \times 8 - L_{TB,24}$$

End if of A
End if of R
[End]

$$TBS = \left\lceil \frac{A + L_{TB,24}}{C \times 8} \right\rceil \times C \times 8 - L_{TB,24}$$

may be transformed to $$TBS = \left\lfloor \frac{A + L_{TB,24}}{C \times 8} \right\rfloor \times C \times 8 - L_{TB,24}$$

and then applied.

---

[pseudo-code 8]
[Start]
If R ≤ 1/4,
    If A ≤ 3824, $$C = 1 \text{ and } TBS = \left\lceil \frac{A}{8} \right\rceil \times 8.$$

Else $$C = \left\lceil \frac{A + 24}{3816} \right\rceil$$

$$TBS = \left\lceil \frac{A + 24}{C \times 8} \right\rceil \times C \times 8 - 24$$

End if of A
Else
    If A ≤ 8424, $$C = 1 \text{ and } TBS = \left\lceil \frac{A}{8} \right\rceil \times 8.$$

Else $$C = \left\lceil \frac{A + 24}{8424} \right\rceil$$

$$TBS = \left\lceil \frac{A + 24}{C \times 8} \right\rceil \times C \times 8 - 24$$

End if of A
End if of R
[End]

---

[pseudo-code 7] above may be transformed to [pseudo-code 7-A], [pseudo-code 7-B], or [pseudo-code 7-C] below and then applied. The following pseudo-code fragments may be methods based on the assumption that the TB-CRC has been already added.

---

[pseudo-code 7-A]
[Start]
If R ≤ $R_1$,
    If A ≤ $N_{2,max}$, $$C = 1 \text{ and } TBS = \left\lceil \frac{A}{8} \right\rceil \times 8 - L_{TB,16}.$$

Else $$C = \left\lceil \frac{A}{N_{2,max} - L_{TB,24}} \right\rceil$$

$$TBS = \left\lceil \frac{A}{C \times 8} \right\rceil \times C \times 8 - L_{TB,24}$$

End if of A
Else
    If A ≤ $N_{1,max}$, $$C = 1 \text{ and } TBS = \left\lceil \frac{A}{8} \right\rceil \times 8 - L_{TB,24}.$$

Else $$C = \left\lceil \frac{A}{N_{1,max} - L_{TB,24}} \right\rceil$$

$$TBS = \left\lceil \frac{A}{C \times 8} \right\rceil \times C \times 8 - L_{TB,24}$$

End if of A
End if of R
[End]

---

[pseudo-code 7-B]
[Start]
If $I_{MCS} \leq I_{MCS,BG\#2}$,
    If A ≤ $N_{2,max}$, $$C = 1 \text{ and } TBS = \left\lceil \frac{A}{8} \right\rceil \times 8 - L_{TB,16}.$$

```
Else

C = ⌈ A / (N_{2,max} - L_{TB,24}) ⌉

TBS = ⌈ A / (C × 8) ⌉ × C × 8 - L_{TB,24}

End if of A
Else
    If A ≤ N_{1,max},

C = 1 and TBS = ⌈ A / 8 ⌉ × 8 - L_{TB,24}.

Else

C = ⌈ A / (N_{1,max} - L_{TB,24}) ⌉

TBS = ⌈ A / (C × 8) ⌉ × C × 8 - L_{TB,24}

End if of A
End if of R
[End]
```

$I_{MCS}$ may be an MCS index or a parameter related to an MSC or a code rate. $I_{MCS,BG\ \#2}$ may be a reference value of $I_{MCS}$ for selecting BG #2.

```
[pseudo-code 7-C]
[Start]
If R ≤ R_1,
    If A ≤ N_{2,max},

C = 1 and TBS = ⌈ A / (α × 8) ⌉ × α × 8 - L_{TB,16}.

Else

C = ⌈ A / (N_{2,max} - L_{TB,24}) ⌉

TBS = ⌈ A / (α × C × 8) ⌉ × α × C × 8 - L_{TB,24}

End if of A
Else
    If A ≤ N_{1,max},

C = 1 and TBS = ⌈ A / (α × 8) ⌉ × α × 8 - L_{TB,24}.

Else

C = ⌈ A / (N_{1,max} - L_{TB,24}) ⌉

TBS = ⌈ A / (α × C × 8) ⌉ × α × C × 8 - L_{TB,24}

End if of A
End if of R
[End]
```

α is a quantization factor, and may be a value for determining granularity of the TBS. α may be a value set by, and thus known by, the base station and the terminal, or a value that the base station configures in the terminal through higher-layer signaling. Alternatively, α may be a value determined according to the value of A or C.

[pseudo-code 8] above may be transformed to [pseudo-code 8-A] below and then applied.

```
[pseudo-code 8-A]
[Start]
If R ≤ 1/4,
    If A ≤ 3840,
        C = 1

TBS = ⌈ A / 8 ⌉ × 8 - 16.

Else

C = ⌈ A / 3816 ⌉

TBS = ⌈ A / (C × 8) ⌉ × C × 8 - 24

End if of A
Else
    If A ≤ 8448,

C = 1 and TBS = ⌈ A / 8 ⌉ × 8 - 24.

Else

C = ⌈ A / 8424 ⌉

TBS = ⌈ A / (C × 8) ⌉ × C × 8 - 24

End if of A
End if of R
[End]
```

"If R≤¼," is not limited to "¼" and may be transformed to a value, for example, "If R≤0.28," and then applied. Such a conditional sentence may be applied in a form of comparing the MCS index, such as "If $I_{MCS}$≤3,".

In the above pseudo-code fragments, $L_{TB,16}$ and $L_{TB,24}$ may be different values. The number of CRC bits applied to the value by which A is divided when C is calculated and a value of CRC bits excluded from a process of calculating the TBS may vary depending on the code rate R and the size of calculated A.

$$\lceil A/8 \rceil \times 8$$

may be transformed to $$\lfloor A/8 \rfloor \times 8,$$

A+(8−mod(A,8)), A−mod(A,8), or $$\text{Round}(A/8) \times 8$$

and then applied as described in [Embodiment 1]. Further, $$\left\lceil \frac{A+24}{C \times 8} \right\rceil \times C \times 8 - 24$$

may be transformed to A−(C×8−mod(A+24,C×8)) or A−mod(A+24,C×8) and then applied. In addition, $$TBS = \left\lceil \frac{A+24}{C \times 8} \right\rceil \times C \times 8 - 24$$

may be transformed to $$TBS = \left\lfloor \frac{A+24}{C \times 8} \right\rfloor \times C \times 8 - 24$$

and then applied. Accordingly, the pseudo-code may be transformed to [pseudo-code 9] below and then applied. Further, the application can be performed using another equation causing the same result.

---

[pseudo-code 9]
[Start]
If R ≤ 1/4,
  If A ≤ 3824, $$C = 1 \text{ and } TBS = \left\lceil \frac{A}{8} \right\rceil \times 8.$$

Else $$C = \left\lceil \frac{A+24}{3816} \right\rceil$$

TBS = A − (C × 8 − mod(A + 24, C × 8)) or
    A − mod(A + 24, C × 8)
  End if of A
Else
  If A ≤ 8424, $$C = 1 \text{ and } TBS = \left\lceil \frac{A}{8} \right\rceil \times 8.$$

Else $$C = \left\lceil \frac{A+24}{8424} \right\rceil$$

TBS = A + (C × 8 − mod(A + 24, C × 8)) or
    A − mod(A + 24, C × 8)
  End if of A
End if of R
[End]

---

Step 2-2 may be a process of determining the number C of temporary code blocks (the number of temporary CBs) using determined A and making the length of the CRC of TBS+TB a multiple of 8 and C on the basis thereof.

In the disclosure, mod(x,y) may be a remainder obtained by dividing x by y and may be transformed to x−⌊x/y⌋×y. In the disclosure, ⌈x⌉ is the minimum integer larger than x, and may be interchangeably used with ceil(x). ⌊x⌋ is the maximum integer smaller than x, and may be interchangeably used with floor(x). Round(x) may be an integer that is the closest to x or x when rounded off.

In the equation provided by the present embodiment, C×8 is used for the multiple of the product of 8 and C, but C×8 may be transformed to LCM(8,C) and applied in the above equations.

FIG. 6 is a flowchart illustrating a step in which the base station and the terminal obtain the TBS and transmit and receive data when scheduling and transmitting downlink or uplink data. If the scheduling and data transmission process starts, the base station determines scheduling information in step 602 and transfers the scheduling information through a combination of one or more of DCI, system information, MAC CE, and RRC signaling to the terminal in step 604. The terminal and the base station obtain a TBS from the determined scheduling information in step 606. In step 606, the TBS may be calculated using step 2-1 and step 2-2 described above. Step 2-1 and step 2-2 may be combined and performed at the same time, or the order thereof may be changed. Thereafter, CB segmentation and channel coding, decoding, and retransmission operations are performed using the TBS in step 608, which completes data scheduling and transmission.

The TBS determination method provided by the embodiment can be applied only to the case in which a specific combination of an MCS index and the number of allocated PRBs prearranged between the base station and the terminal is not applied. For example, if scheduling is determined with MCS index 6 and the number of PRBs is 1, the TBS may be determined as a fixed value of 328 and data may be transmitted, rather than through the above method. Accordingly, the base station and the terminal may predetermine and know TBS values according to a combination of {MCS index or code rate index, number of PRBs}, and the TBS may be determined through the method provided by the embodiment only in cases other than the combination.

The TBS determination method according to the present embodiment may correspond only to initial transmission, and, in retransmission, transmission and reception may be performed on the basis of the assumption of the TBS determined in initial transmission of the corresponding retransmission.

Steps 2-1 and 2-2 may correspond to steps 2-A, 2-B, 2-C, and 2-D below.

Step 2-A: determine the number of resources on which data resources are rate-matched (Step 2-A. Count the number of available REs for rate matching of PDSCH/PUSCH ($N_{RE}$))

Step 2-B: calculate a temporary TBS including TB-CRC by multiplying a coding rate, the number of layers, and a modulation order by calculated $N_{RE}$ (Step 2-B: Calculate TBS plus TB-CRC by multiplying coding rate, modulation order, and number of layers to $N_{RE}$)

Step 2-C: make the calculated temporary TBS including the TB-CRC a common multiple of 8 and the number of CBs or a multiple of a value obtained by multiplying 8 and the number of CBs (Step 2-C: Make TBS plus TB-CRC as a common multiple of 8 and the number of CBs)

Step 2-D: calculate a final TBS in consideration of a specific packet size or specific services. Calculate the final TBS excluding the TB-CRC length from the calculated value in step 2-C without the specific packet size or the specific services (Step 2-D: Determine the final TBS, considering specific packet size and services (if applied)).

Embodiment 3

[Embodiment 3] provides a TBS determination method according to selection of CB-CRC and BG. The embodiment may be applied to specific cases in which BG #2 is not applied when the TBS is large. That is, in the present embodiment, the case in which a code block is channel-coded to an LDPC code using BG #2 may be restrictively applied only to the case in which the TB is not segmented into a plurality of code blocks. In the present embodiment, R_1 and R_2 may indicate code rates which are the reference for selecting BG #1 or BG #2 of the LDPC, and $R_1$ and $R_2$ may be interchangeably used. For example, $R_1$=¼ and $R_2$=⅔, but the method provided by the disclosure is not limited thereto. Further, in the disclosure, R, referring to the code rate, $R_1$, and $R_2$ may be expressed and determined in various ways, for example, as a fraction or a decimal. When a BG is selected between BG #1 and BG #2 in data transmission, a code rate and a soft buffer of the terminal may be considered.

The base station may transmit data by allocating frequency resources of a predetermined number of PRBs and time resources of a predetermined number of slots or symbols to the terminal, and scheduling information related thereto may be transmitted to the terminal through downlink control information (DCI), configuration transmitted through higher-layer signaling, or a combination thereof. When scheduling information of the base station and the terminal is given, the TBS may be determined in the following order.

Step 3-1: determine the number (A) of temporary information bits

Step 3-2: process of determining the number (C) of temporary CBs, performing byte alignment (making A a multiple of 8), and making A a multiple (B) of the number of temporary CBs Step 3-3: process of determining a TBS except for the number of CRC bits.

Step 3-1 may be the same as the process of step 1-1 in [Embodiment 1]. In [Step 3-1], a temporary TBS value is determined in consideration of an amount of resource areas to which data to be transmitted can be mapped. The number of temporary information bits may be determined by a combination of one or more of a code rate (R), a modulation order ($Q_m$), the number ($N_{RE}$) of REs to which rate-matched data is mapped, the number of allocated PRBs or RBs (# PRB), the number of allocated OFDM symbols, the number of allocated slots, and a reference value of the number of mapped REs within one PRB.

For example, A may be determined by A=$N_{RE} \times Q_m \times R \times v$, corresponding to [Equation 10]. A modulation order $Q_m$ and a code rate R may be transmitted to the terminal while being included in DCI. The number v of layers used for transmission may be transmitted to the terminal through DCI, higher-layer signaling, or a combination thereof. $N_{RE}$ may be determined by the base station using the number of Res to which data is mapped through rate matching when data is transmitted, and may be equally understood by the base station and the terminal if both the base station and the terminal are aware of resource allocation information. When $N_{RE}$ is calculated, data is mapped through rate matching, but an RE to which data is not mapped due to puncturing of the data for a specific reason such as CSI-RS, URLLC, or UCI transmission is included in $N_{RE}$. This is to make both the base station and the terminal equally understand the TBS even when the base station does not transmit some data scheduled to be mapped in a puncturing scheme without informing the terminal of the same.

An MCS table such as [Table 8] above may be defined, and the base station may transfer an MCS index to the terminal to transmit information on $Q_m$ and R. The modulation order refers to information on QPSK, 16 QAM, 64 QAM, 256 QAM, and 1024 QAM. In [Table 8] above, $Q_m$ and R are transmitted together by an MCS index of 5 bits, but may be transmitted to the terminal in various methods such that $Q_m$ and R are transmitted by an MCS index of 6 bits through DCI or such that each of $Q_m$ of 3 bits and R of 3 bits uses a bit field. Alternatively, A=(number of allocated PRBs)×(number of reference REs per PRB)×$Q_m \times R \times v$.

Step 3-2 is a step of determining the number C of temporary code blocks (the number of temporary CBs) using determined A and making A a multiple (B) of 8 and the number of temporary CBs. This is to make the finally determined TBS and the length of the CRC added to the TB byte-aligned and also a multiple of the CB.

$$C = \left\lceil \frac{A}{N_{1,max}} \right\rceil.$$

First, the number of temporary CBs may be determined as $N_{1,max}$ may be 8448. C, obtained above, may be the number of temporary CBs. CB segmentation is performed when the TB is finally transmitted, and the number of temporary CBs may be different from the number of actually obtained CBs, but it may be determined that the numbers of actual CBs and temporary CBs may be the same as each other.

A process of generating B by making A, determined in step 3-1, a multiple of 8 and C is performed, which is to prevent all code blocks from being transmitted while including an unnecessary bit or an unnecessary zero padding bit. B may be calculated as shown in [Equation 11] of $$B = \left\lceil \frac{A}{8C} \right\rceil \times 8C.$$

[Equation 11] above may be changed to $$B = \left\lfloor \frac{A}{8C} \right\rfloor \times 8C,$$

B=A+(8C−mod(A,8C)), and B=A−mod(A,8C) and then applied. In the disclosure, mod(x,y) may be a remainder obtained by dividing x by y and may be transformed to x−⌊x/y⌋×y and then applied. In the disclosure, ⌈x⌉ is a minimum integer larger than x, and may be interchangeably used with ceil(x). ⌊x⌋ is a maximum integer smaller than x, and may be interchangeably used with floor(x).

[Equation 11] may be transformed to $$B = \text{Round}\left(\frac{A}{8C}\right) \times 8C$$

and applied, which means that B is a multiple of 8C, which is the closest to A. Round(x) may be an integer that is the closest to x or x rounded off [Equation 11] functions to make A a multiple of 8C, but may be transformed to an equation for making A a common multiple or the lowest common multiple of 8 and C. Accordingly, [Equation 11] above may be transformed to $$B = \left\lceil \frac{A}{LCM(8,C)} \right\rceil \times LCM(8,C),$$

-continued $$B = \left\lfloor \frac{A}{LCM(8, C)} \right\rfloor \times LCM(8, C), \text{ or}$$

$$B = \text{Round}\left(\frac{A}{LCM(8, C)}\right) \times LCM(8, C)$$

and then applied. LCM(a,b) is the lowest common multiple of a and b.

Information bits transmitted in allocated resources are obtained in steps to step 3-2, and a process of excluding the number of bits added for the CRC from the obtained information bits to be transmitted is performed in final step 3-3. This may be determined by [pseudo-code 10] or [pseudo-code 11] below.

```
[pseudo-code 10]
[Start]
If B ≤ N_{2,max}, then TBS = B - L_{TB,16}
Else if B ≤ N_{1,max}, then TBS = B - L_{TB,24}
Else TBS = B - L_{TB,24} - C× L_{CB}
End if of B
[End]
```

```
[pseudo-code 11]
[Start]
If B ≤ 3840, then TBS = B - 16
Else if B ≤ 8448, then TBS = B - 24
Else TBS = B - 24×(C+1)
End if of B
[End]
```

$L_{TB,16}$ and $L_{TB,24}$ are considered, since the CRC length applied to the TB varies depending on the TBS. If the number of code blocks is 1, the CRC added to the CB may be omitted, or the CRC length added to the CB may be 0.

In another example, step 3-3 may be transformed to [pseudo-code 5] or [pseudo-code 6] and then applied. In [pseudo-code 5] or [pseudo-code 6], the CRC length added to the CB is not excluded in order to obtain the final TBS. Accordingly, when actual data is subsequently mapped and transmitted, the CRC length of the CB may be added to the obtained TBS, and thus an actual code rate may be larger than R.

FIG. 6 is a flowchart illustrating a step in which the base station and the terminal obtain the TBS and transmit and receive data when scheduling and transmitting downlink or uplink data. When the scheduling and data transmission process starts, the base station determines scheduling information in step 602 and transfers the scheduling information through a combination of one or more of DCI, system information, MAC CE, and RRC signaling to the terminal in step 604. The terminal and the base station obtain a TBS from the determined scheduling information in step 606. In step 606, the TBS may be obtained using step 3-1, step 3-2, and step 3-3 described above. Step 3-1, step 3-2, and step 3-3 may be combined and performed at the same time, or the order thereof may be changed. Thereafter, CB segmentation and channel coding, decoding, and retransmission operations are performed using the TBS in step 608, which completes data scheduling and transmission.

The TBS determination method provided by the embodiment can be applied only to the case in which a specific combination of an MCS index and the number of allocated PRBs prearranged between the base station and the terminal is not applied. For example, if scheduling is determined with MCS index 6 and the number of PRBs is 1, the TBS may be determined as a fixed value of 328 and data may be transmitted, rather than through the above method. Accordingly, the base station and the terminal may predetermine and know TBS values according to a combination of {MCS index or code rate index, number of PRBs}, and the TBS may be determined through the method provided by the embodiment only in cases other than the combination.

The TBS determination method according to the present embodiment may correspond only to initial transmission, and in retransmission, transmission and reception may be performed on the basis of the assumption of the TBS determined in initial transmission of the corresponding retransmission.

Embodiment 4

[Embodiment 4] provides a TBS determination method according to selection of CB-CRC and BG. The present embodiment may be applied to specific cases in which BG #2 is not applied when the TBS is large. That is, in the present embodiment, the case in which the code block is channel-coded to an LDPC code using BG #2 may be restrictively applied only to the case in which the TB is not segmented into a plurality of code blocks. In the present embodiment, R_1 and R_2 may indicate code rates which are the reference for selecting BG #1 or BG #2 of the LDPC, and $R_1$ and $R_2$ may be interchangeably used. For example, $R_1 = 1/4$ and $R_2 = 2/3$, but the method provided by the disclosure is not limited thereto. Further, in the disclosure, R, referring to the code rate, $R_1$, and $R_2$ may be expressed and determined in various ways, for example, as a fraction or a decimal. When a BG is selected between BG #1 and BG #2 in data transmission, a code rate and a soft buffer of the terminal may be considered. In the present embodiment, a process for making the TBS a multiple of 8, a multiple of the number of CBs, or a common multiple or the lowest common multiple of 8 and the number of CBs may be performed at the end of TBS calculation.

The base station may transmit data by allocating frequency resources of a predetermined number of PRBs and time resources of a predetermined number of slots or symbols to the terminal, and scheduling information related thereto may be transmitted to the terminal through downlink control information (DCI), configuration transmitted through higher-layer signaling, or a combination thereof. When scheduling information of the base station and the terminal is given, the TBS may be determined in the following order.

Step 4-1: determine the number (A) of temporary information bits

Step 4-2: process of determining the number of temporary CBs, making a value obtained by adding the TB-CRC length to the TBS to be byte-aligned and be a multiple of the number of CBs Step 4-1 may be the same as the process of step 2-1 in [Embodiment 2]. In [Step 4-1], a temporary TBS value is determined in consideration of an amount of resource areas to which data to be transmitted can be mapped. The number of temporary information bits may be determined by a combination of one or more of a code rate (R), a modulation order ($Q_m$), the number ($N_{RE}$) of REs to which rate-matched data is mapped, the number of allocated PRBs or RBs (# PRB), the number of allocated OFDM symbols, the number of allocated slots, and a reference value of the number of mapped REs within one PRB. For example, A may be determined by [Equation 10] above. A modulation order $Q_m$ and a code rate R may be transmitted to the terminal while being included in DCI. The number v of layers used for transmission may be transmitted to the terminal through DCI, higher-layer signaling, or a combination thereof. $N_{RE}$ may be determined by the base station using the number of REs to which data is mapped through rate matching when data is transmitted, and may be equally understood by the base station and the terminal if both the base station and the terminal are aware of resource allocation information. When $N_{RE}$ is calculated, data is mapped through rate matching, but an RE to which data is not mapped due to puncturing of the data for a specific reason such as CSI-RS, URLLC, or UCI transmission is included in $N_{RE}$. This is to make both the base station and the terminal equally understand the TBS even when the base station does not transmit some data scheduled to be mapped in a puncturing scheme without informing the terminal of the same.

An MCS table such as [Table 8] above may be defined, and the base station may transfer an MCS index to the terminal to transmit information on $Q_m$ and R. The modulation order refers to information on QPSK, 16 QAM, 64 QAM, 256 QAM, and 1024 QAM. In [Table 8] above, $Q_m$ and R are transmitted together by an MCS index of 5 bits, but may be transmitted to the terminal in various methods such that $Q_m$ and R are transmitted by an MCS index of 6 bits through DCI or such that each of $Q_m$ of 3 bits and R of 3 bits uses a bit field. Alternatively, A=(number of allocated PRBs)×(number of reference REs per PRB)×$Q_m$×R×v.

Step 4-2 may be performed as shown in [pseudo-code 12] or [pseudo-code 13].

---

[pseudo-code 12]
[Start]
If $A \le N_{1,max} - L_{TB,24}$, $C = 1$ and $TBS = \left\lceil \frac{A}{8} \right\rceil \times 8$.

Else $$C = \left\lceil \frac{A + L_{TB,24}}{N_{1,max} - L_{TB,24}} \right\rceil$$

$$TBS = \left\lceil \frac{A + L_{TB,24}}{C \times 8} \right\rceil \times C \times 8 - L_{TB,24}$$

End if of A
[End]

$$TBS = \left\lceil \frac{A + L_{TB,24}}{C \times 8} \right\rceil \times C \times 8 - L_{TB,24}$$

may be transformed to $$TBS = \left\lfloor \frac{A + L_{TB,24}}{C \times 8} \right\rfloor \times C \times 8 - L_{TB,24}$$

and then applied.

---

[pseudo-code 13]
[Start]
If $A \le 8424$, $C = 1$ and $TBS = \left\lceil \frac{A}{8} \right\rceil \times 8$.

Else $$C = \left\lceil \frac{A + 24}{8424} \right\rceil$$

$$TBS = \left\lceil \frac{A + 24}{C \times 8} \right\rceil \times C \times 8 - 24$$

End if of A
[End]

---

Alternatively, [pseudo-code 12] may be transformed to [pseudo-code 14] and then applied.

---

[pseudo-code 14]
[Start]

$$C = \left\lceil \frac{A + L_{TB,24}}{N_{1,max} - L_{TB,24}} \right\rceil$$

$$TBS = \left\lceil \frac{A + L_{TB,24}}{C \times 8} \right\rceil \times C \times 8 - L_{TB,24}$$

[End]

---

$$\left\lceil \frac{A}{8} \right\rceil \times 8$$

may be transformed to $$\left\lfloor \frac{A}{8} \right\rfloor \times 8,$$

A+(8−mod(A,8)), A−mod(A,8), or $$\text{Round}\left(\frac{A}{8}\right) \times 8$$

and then applied as described in [Embodiment 1].

$$\left\lceil \frac{A + 24}{C \times 8} \right\rceil \times C \times 8 - 24$$

may be transformed to A+(C×8−mod(A+24,C×8)) or A+(C×8−mod(A+24,C×8)) and then applied. For example, transformation to [pseudo-code 14] may be performed and applied.

---

[pseudo-code 14]
[Start]
If $A \le 8424$, $C = 1$ and $TBS = \left\lceil \frac{A}{8} \right\rceil \times 8$.

Else $$C = \left\lceil \frac{A + 24}{8424} \right\rceil$$

TBS = A + (C × 8 − mod(A + 24, C × 8)) or A − mod(A + 24, C × 8)
End if of A
[End]

Step 4-2 may be a process of determining the number C of temporary code blocks (the number of temporary CBs) using the determined A and making the length of the CRC of TBS+TB a multiple of 8 and C on the basis thereof. The use of C×8 in the above equations is to make A a multiple of 8C, but may be transformed to make the same a common multiple or the lowest multiple common of 8 and C and applied. Accordingly, in the above equations, C×8 may be transformed to LCM(8,C) and applied. LCM(a,b) is the lowest common multiple of a and b.

In the disclosure, mod(x,y) may be a remainder obtained by dividing x by y, and may be transformed to x−⌊x/y⌋×y. In the disclosure, ⌈x⌉ is a minimum integer larger than x, and may be interchangeably used with ceil(x). ⌊x⌋ is a maximum integer smaller than x, and may be interchangeably used with floor(x). Round(x) may be an integer that is the closest to x or x rounded off.

FIG. 6 is a flowchart illustrating a step in which the base station and the terminal obtain the TBS and transmit and receive data when scheduling and transmitting downlink or uplink data. If the scheduling and data transmission process starts, the base station determines scheduling information in step 602, and transfers the scheduling information through a combination of one or more of DCI, system information, MAC CE, and RRC signaling to the terminal in step 604. The terminal and the base station obtain a TBS from the determined scheduling information in step 606. In step 606, the TBS may be calculated using step 4-1 and step 4-2 described above. Step 4-1 and step 4-2 may be combined and performed at the same time, or the order thereof may be changed. Thereafter, CB segmentation and channel coding, decoding, and retransmission operations are performed using the TBS in step 608, which completes data scheduling and transmission.

The TBS determination method provided by the embodiment can be applied only to the case in which a specific combination of an MCS index and the number of allocated PRBs prearranged between the base station and the terminal is not applied. For example, if scheduling is determined with MCS index 6 and the number of PRBs is 1, the TBS may be determined as a fixed value of 328 and data may be transmitted, rather than through the above method. Accordingly, the base station and the terminal may predetermine and know TBS values according to a combination of {MCS index or code rate index, number of PRBs}, and the TBS may be determined through the method provided by the embodiment only in cases other than the combination.

The TBS determination method according to the present embodiment may correspond only to initial transmission, and, in retransmission, transmission and reception may be performed on the basis of the assumption of the TBS determined in initial transmission of the corresponding retransmission.

The part of determining the TBS by comparing the code rate R with a specific value in [Embodiment 1], [Embodiment 2], [Embodiment 3], or [Embodiment 4] may be modified to a method of comparing an MCS index such as $I_{MCS}$ or a parameter related to an MCS or a code rate with a specific reference value instead of directly using the code rate for comparison.

Further, the case in which data is mapped using rate matching is described in [Embodiment 1], [Embodiment 2], [Embodiment 3], or [Embodiment 4] when $N_{RE}$ is calculated, but $N_{RE}$ may be calculated using various methods. For example, $N_{RE}$ may be calculated and applied through a method considering one or more of the total number of allocated symbols, the number of allocated PRBs, synchronization signal block resources, reference signal resources, reserved resources, subcarrier spacing, the number of allocated slots, a code rate, a modulation order, and the number of reference REs within specific resources (for example, the number of available REs within one PRB of one slot or one symbol).

Embodiment 5

[Embodiment 5] provides a method by which, if a specific TBS is calculated and derived, the base station and the terminal modify the calculated TBS and apply the final TBS when [Embodiment 1], [Embodiment 2], [Embodiment 3], or [Embodiment 4] is applied.

For example, the base station and the terminal may prearrange that a TBS in a specific range is not transmitted, and if the TBS in the specific range is calculated, a TBS to be applied may be predetermined. For example, in the process, R<¼ and A=3872, and thus the number of temporary CBs is calculated as 2. If B=3872, the finally calculated TBS is 3800. If the finally calculated TBS is 3800, the terminal may determine the TBS to be 3840.

In another example, a method of applying the final TBS by comparing a TBS, calculated in the case in which the base station and the terminal know a minimum value or a maximum value of the TBS, with the minimum value or the maximum value prearranged or known through higher-layer signaling may be used. The minimum value of the TBS may be $TBS_{min}$, and the maximum value of the TBS may be $TBS_{max}$.

Embodiment 6

[Embodiment 6] provides a method of storing information on data received by the terminal in a soft buffer.

When transmitting downlink data, the base station may know in advance how much data is stored by the terminal when the terminal stores the received information on the data in the soft buffer, and may accordingly inform the terminal of the start time point of the stored information. The base station may inform the terminal of the range of the stored information, and thus transmit a parity part having the highest probability of being retransmitted.

This may be indicated to the terminal by the base station through one or more of RRC signaling, MAC CE, DCI, or L1 signaling such as SIB.

Embodiment 7

[Embodiment 7] provides a method of calculating $N_{RE}$, which is the number of resource areas to which data considered for calculation of a temporary TBS can be mapped, when [Embodiment 1], [Embodiment 2], [Embodiment 3], or [Embodiment 4] is applied.

Downlink data may be transmitted using a PDSCH, which is a physical channel for downlink data transmission, and at this time $N_{RE}$ may be obtained in consideration of one or more of the following parameters.

The number of PRBs allocated for data transmission and the number of symbols to be transmitted A control resource set (CORESET) in which a downlink control channel, signaled in a higher layer, can be transmitted An area to which scheduled DCI is mapped A resource area in which a reference signal (RS) used for data transmission is transmitted A resource area corresponding to reserved resources A resource in which an RS for channel measurement is transmitted An area in which a synchronization signal block (SS block) including synchronization signals is transmitted Timing at which control information (DCI) for scheduling is transmitted and timing at which an actual PDSCH is to be transmitted A minimum processing time for uplink and downlink data transmission and reception Uplink data may be transmitted using a PUSCH, which is a physical channel for uplink data transmission, and at this time $N_{RE}$ may be obtained in consideration of one or more of the following parameters.

The number of PRBs allocated for data transmission and the number of symbols to be transmitted An area in which a downlink and uplink control channel, signaled in a higher layer, can be transmitted A resource area in which a reference signal used for data transmission is transmitted A resource area corresponding to reserved resources A resource area in which a sounding reference signal (SRS) for channel measurement is transmitted An area in which a synchronization signal block including a synchronization signal is transmitted Timing at which control information (uplink grant DCI) for scheduling is transmitted and timing at which an actual PUSCH is to be transmitted Whether HARQ-ACK information of another PDSCH is included and transmitted, the timing at which the corresponding PDSCH is transmitted, and the amount of HARQ-ACK information to be transmitted Measurement for a channel state information (CSI) report, report timing, and an amount of CSI A minimum processing time for uplink and downlink data transmission and reception For example, if HARQ-ACK of the PDSCH received before a time point at which DCI including a grant (uplink grant) for uplink scheduling for scheduling the corresponding PUSCH is transmitted is larger than the number of specific bits, a resource area required for transmitting corresponding HARQ-ACK information may be excluded from $N_{RE}$ obtained for PUSCH transmission. On the other hand, transmission of HARQ-ACK information of the PDSCH received at or after a time point at which DCI including an uplink grant for scheduling the corresponding PUSCH is transmitted may not be considered or included in the calculation of $N_{RE}$ for obtaining the TBS of the PUSCH. A reference time point of the PDSCH considering HARQ-ACK has been described as the time point at which the uplink grant is received, but is not limited thereto, and may be determined, for example, according to a minimum processing time for uplink data transmission, downlink data reception, and HARQ-ACK transmission. This is to secure a processing time enough to process the TBS of the PUSCH.

Figure 7:
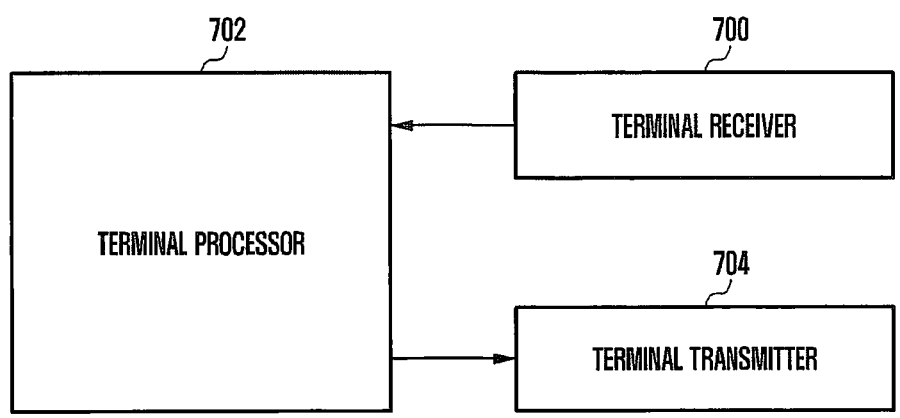
FIG. 7 is a block diagram illustrating the structure of the terminal according to embodiments of the disclosure.
Figure 8:
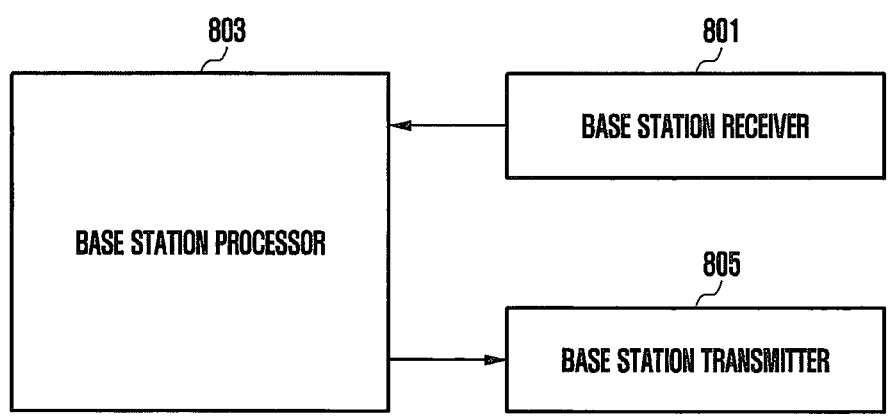
FIG. 8 is a block diagram illustrating the structure of the base station according to embodiments of the disclosure.

In order to perform the above-described embodiments of the disclosure, a transmitter, a receiver, and a processor of each of the terminal and the base station are illustrated in FIGS. 7 and 8. Transmission/reception methods of the base station and the terminal are described to perform embodiments 1 to 7, and each of receivers, processors, and transmitters of the base station and the terminal should operate according to embodiments in order to implement the methods.

Specifically, FIG. 7 is a block diagram illustrating the internal structure of a terminal according to an embodiment of the disclosure. As illustrated in FIG. 7, the terminal of the disclosure may include a terminal receiver 700, a terminal transmitter 704, and a terminal processor 702. The terminal receiver 700 and the terminal transmitter 704 are commonly called a transceiver in the embodiments of the disclosure. The transceiver may transmit and receive a signal to/from the base station. The signal may include control information and data. To this end, the transceiver may include an RF transmitter that up-converts and amplifies the frequency of a transmitted signal, an RF receiver that low-noise amplifies a received signal and down-converts the frequency, and the like. Also, the transceiver may receive a signal through a radio channel, output the signal to the terminal processor 702, and transmit the signal output from the terminal processor 702 through a radio channel. The terminal processor 702 may control a series of processes such that the terminal operates according to the above-described embodiments of the disclosure.

FIG. 8 is a block diagram illustrating the internal structure of a base station according to an embodiment of the disclosure. As illustrated in FIG. 8, the base station of the disclosure may include an base station receiver 801, a base station transmitter 805, and a base station processor 803. The base station receiver 801 and the base station transmitter 805 are commonly called a transceiver in the embodiments of the disclosure. The transceiver may transmit and receive a signal to and from the terminal. The signal may include control information and data. To this end, the transceiver includes an RF transmitter that up-converts and amplifies the frequency of a transmitted signal, an RF receiver that low-noise amplifies a received signal and down-converts the frequency, and the like. Also, the transceiver may receive a signal through a radio channel, output the signal to the base station processor 803, and transmit the signal output from the terminal processor 803 through a radio channel. The base station processor 803 may control a series of processes such that the base station operates according to the above-described embodiments of the disclosure.

Meanwhile, the embodiments of the disclosure disclosed in the specification and the drawings have been presented to easily explain technical contents of the disclosure and help comprehension of the disclosure, and do not limit the scope of the disclosure. That is, it is obvious to those skilled in the art to which the disclosure belongs that different modifications can be achieved based on the technical spirit of the disclosure. Some of the embodiments may be operated such that one or more thereof are combined. For example, the base station and the terminal may operate on the basis of a combination of [Embodiment 1] and [Embodiment 3] of the disclosure.

The invention claimed is:
1. A method performed by a terminal in a wireless communication system, the method comprising:
receiving control information for scheduling downlink data from a base station;

identifying a number of temporary information bits based on a modulation order and a code rate of the downlink data, the modulation order and the code rate being associated with the control information;

identifying a transport block size (TBS), based on at least one of the code rate of the downlink data or the number of temporary information bits; and decoding the downlink data, based on the identified TBS, wherein the TBS is a number identified by subtracting 24 from a multiple of both 8 and a number of code blocks (CBs) for identifying the TBS, wherein the number of CBs for identifying the TBS is identified based on the number of temporary information bits and whether the code rate of the downlink data is equal to or smaller than ¼ or not, and wherein, when the code rate of the downlink data is equal to or smaller than ¼, the number of CBs for identifying the TBS is identified based on $$\left\lceil \frac{N+24}{3816} \right\rceil,$$

where N is the number of temporary information bits.

2. The method of claim 1, wherein, when the code rate of the downlink data is larger than ¼ and the number of temporary information bits N is larger than 8424, the number of CBs for identifying the TBS is identified based on $$\left\lceil \frac{N+24}{8424} \right\rceil.$$

3. The method of claim 1, wherein, when the code rate of the downlink data is larger than ¼ and the number of temporary information bits is equal to or smaller than 8424, the number of CBs for identifying the TBS is 1.

4. The method of claim 1, wherein the number of temporary information bits is identified based on the modulation order, the code rate of the downlink data, a number of layers, and a number of resource elements (REs) for the downlink data.

5. A method performed by a base station in a wireless communication system, the method comprising:

transmitting control information for scheduling downlink data to a terminal; and transmitting the downlink data, based on a transport block size (TBS) to the terminal, wherein the TBS is a number obtained by subtracting 24 from a multiple of both 8 and a number of code blocks (CBs) for identifying the TBS, wherein the number of CBs for identifying the TBS depends on a number of temporary information bits and whether a code rate of the downlink data is equal to or smaller than ¼ or not, wherein the number of temporary information bits is based on a modulation order and the code rate of the downlink data, the modulation order and the code rate being associated with the control information, and wherein, when the code rate of the downlink data is equal to or smaller than ¼, the number of CBs for identifying the TBS is $$\left\lceil \frac{N+24}{3816} \right\rceil,$$

where N is the number of temporary information bits.

6. The method of claim 5, wherein, when the code rate of the downlink data is larger than ¼ and the number of temporary information bits N is larger than 8424, the number of CBs for identifying the TBS is $$\left\lceil \frac{N+24}{8424} \right\rceil.$$

7. The method of claim 5, wherein, when the code rate of the downlink data is larger than ¼ and the number of temporary information bits is equal to or smaller than 8424, the number of CBs for identifying the TBS is 1.

8. The method of claim 5, wherein the number of temporary information bits is based on the modulation order, the code rate of the downlink data, a number of layers, and a number of resource elements (REs) for the downlink data.

9. A terminal in a wireless communication system, the terminal comprising:

a transceiver; and a controller coupled with the transceiver and configured to:

receive control information for scheduling downlink data from a base station, identify a number of temporary information bits based on a modulation order and a code rate of the downlink data, the modulation order and the code rate being associated with the control information, identify a transport block size (TBS), based on at least one of the code rate of the downlink data or the number of temporary information bits, and decode the downlink data, based on the identified TBS, wherein the TBS is a number identified by subtracting 24 from a multiple of both 8 and a number of code blocks (CBs) for identifying the TBS, wherein the number of CBs for identifying the TBS is identified based on the number of temporary information bits and whether the code rate of the downlink data is equal to or smaller than ¼ or not, and wherein, when the code rate of the downlink data is equal to or smaller than ¼, the number of CBs for identifying the TBS is identified based on $$\left\lceil \frac{N+24}{3816} \right\rceil,$$

where N is the number of temporary information bits.

10. The terminal of claim 9, wherein, when the code rate of the downlink data is larger than ¼ and the number of temporary information bits N is larger than 8424, the number of CBs for identifying the TBS is identified based on $$\left\lceil \frac{N+24}{8424} \right\rceil.$$

11. The terminal of claim 9, wherein, when the code rate of the downlink data is larger than ¼ and the number of temporary information bits is equal to or smaller than 8424, the number of CBs for identifying the TBS is 1.

12. The terminal of claim 9, wherein the number of temporary information bits is identified based on the modulation order, the code rate of the downlink data, a number of layers, and a number of resource elements (REs) for the downlink data.

13. A base station in a wireless communication system, the base station comprising:
- a transceiver; and
- a controller coupled with the transceiver and configured to:
- transmit control information for scheduling downlink data to a terminal, and
- transmit the downlink data, based on a transport block size (TBS) to the terminal,
- wherein the TBS is a number obtained by subtracting 24 from a multiple of both 8 and a number of code blocks (CBs) for identifying the TBS,
- wherein the number of CBs for identifying the TBS depends on a number of temporary information bits and whether a code rate of the downlink data is equal to or smaller than ¼ or not,
- wherein the number of temporary information bits is based on a modulation order and the code rate of the downlink data, the modulation order and the code rate being associated with the control information, and
- wherein, when the code rate of the downlink data is equal to or smaller than ¼, the number of CBs for identifying the TBS is $$\left\lceil \frac{N+24}{3816} \right\rceil,$$

where N is the number of temporary information bits.

14. The base station of claim 13, wherein when the code rate of the downlink data is larger than ¼ and the number of temporary information bits N is larger than 8424, the number of CBs for identifying the TBS is $$\left\lceil \frac{N+24}{8424} \right\rceil.$$

15. The base station of claim 13, wherein when the code rate of the downlink data is larger than ¼ and the number of temporary information bits is equal to or smaller than 8424, the number of CBs for identifying the TBS is 1.

16. The base station of claim 13, wherein the number of temporary information bits is based on the modulation order, the code rate of the downlink data, a number of layers, and a number of resource elements (REs) for the downlink data.

* * * * *